(12) United States Patent
Park et al.

(10) Patent No.: US 12,058,920 B2
(45) Date of Patent: Aug. 6, 2024

(54) SUBSTRATE CONNECTION STRUCTURE OF DISPLAY DEVICE AND METHOD OF PROVIDING THE SAME

(71) Applicant: Samsung Display Co., LTD., Yongin-si (KR)

(72) Inventors: Junehyoung Park, Seoul (KR); Yong-Hoon Kwon, Suwon-si (KR); Hyun A Lee, Seoul (KR); Hyunji Lee, Gimhae-si (KR); Somi Jung, Busan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 180 days.

(21) Appl. No.: 17/239,998

(22) Filed: Apr. 26, 2021

(65) Prior Publication Data

US 2021/0351386 A1    Nov. 11, 2021

(30) Foreign Application Priority Data

May 8, 2020  (KR) ........................ 10-2020-0055213

(51) Int. Cl.
*H10K 71/00*   (2023.01)
*H10K 59/12*   (2023.01)
(Continued)

(52) U.S. Cl.
CPC .......... *H10K 71/00* (2023.02); *H10K 59/131* (2023.02); *H10K 59/65* (2023.02); *H10K 59/1201* (2023.02)

(58) Field of Classification Search
CPC . H01L 51/56; H01L 27/323; H01L 27/43276; H01L 2227/323; H10K 71/00;
(Continued)

(56) References Cited

U.S. PATENT DOCUMENTS

2011/0165814 A1\* 7/2011 Jung-Min ............ B23K 26/073
                                                          219/121.73
2012/0080671 A1\* 4/2012 Niboshi ................ H01L 51/524
                                                          438/26
(Continued)

FOREIGN PATENT DOCUMENTS

KR       10-1927438 B1    12/2018
KR       1020190055860 A   5/2019
KR       1020190091711 A   8/2019

*Primary Examiner* — Eric W Jones
(74) *Attorney, Agent, or Firm* — CANTOR COLBURN LLP

(57) ABSTRACT

A manufacturing method of a display device includes providing an image display layer on a first substrate comprising a first transmission area and a display area around the first transmission area, the pixel layer overlapping the display area, providing a second substrate facing the first substrate, the second substrate comprising a second transmission area overlapping the first transmission area, providing a transparent material between the first transmission area and the second transmission area, and melting each of a portion of the first transmission area adjacent to the transparent material, the transparent material, and a portion of the second transmission area adjacent to the transparent material to form a connection portion that connects the first transmission area and the second transmission area.

20 Claims, 25 Drawing Sheets

(51) Int. Cl.
*H10K 59/131* (2023.01)
*H10K 59/65* (2023.01)

(58) Field of Classification Search
CPC ... H10K 59/131; H10K 59/65; H10K 59/1201
USPC .................................................... 257/40, 59
See application file for complete search history.

(56) References Cited

U.S. PATENT DOCUMENTS

| | | | |
|---|---|---|---|
| 2012/0099061 A1* | 4/2012 | Lee ................... | H10K 50/8426 |
| | | | 349/110 |
| 2012/0104933 A1* | 5/2012 | Jung .................. | H01L 51/5246 |
| | | | 445/25 |
| 2012/0240632 A1* | 9/2012 | Matsumoto ........ | B23K 26/0006 |
| | | | 65/60.53 |
| 2014/0054569 A1* | 2/2014 | Roh ................... | H10K 50/8426 |
| | | | 438/26 |
| 2014/0339510 A1* | 11/2014 | Lee .................... | H01L 51/5246 |
| | | | 257/40 |
| 2015/0027168 A1* | 1/2015 | Dabich, II .......... | C03C 23/0025 |
| | | | 65/41 |
| 2016/0356074 A1* | 12/2016 | Veerasamy ......... | E06B 3/67334 |
| 2017/0277219 A1* | 9/2017 | Chung ................ | H01L 51/5284 |
| 2017/0327419 A1* | 11/2017 | Boek ...................... | C03C 17/06 |
| 2019/0033650 A1 | 1/2019 | Feng et al. | |
| 2019/0148475 A1 | 5/2019 | Seo et al. | |
| 2020/0106057 A1 | 4/2020 | Yoo et al. | |
| 2020/0135800 A1 | 4/2020 | Seo | |

* cited by examiner

SUBSTRATE CONNECTION STRUCTURE OF DISPLAY DEVICE AND METHOD OF PROVIDING THE SAME

This application claims priority to Korean Patent Application No. 10-2020-0055213, filed on May 8, 2020, and all the benefits accruing therefrom under 35 U.S.C. § 119, the contents of which are hereby incorporated by reference in its entirety.

BACKGROUND

1. Field

The present disclosure relates to a display device and a method of manufacturing the display device.

2. Description of the Related Art

In general, electronic devices that display images, such as a smart phone, a digital camera, a notebook computer, a navigation unit and a smart television, include a display device to display the images. The display device generates the images and provides the images to outside the display device through a display screen.

The display device includes a display module generating the images and sensors which provide a variety of functions of the display device. For example, the display device includes a front camera which provides an image-capturing function of the display device. The front camera generates the images using an external light incident thereto. Accordingly, an area of the display device at which the front camera is disposed has a high light transmittance to capture and generate the images.

SUMMARY

One or more embodiment provides a display device having a high light transmittance in an area overlapping a sensor.

One or more embodiment provides a method of manufacturing the display device.

Embodiments provide a method of manufacturing a display device. The method includes providing an image display layer on a first substrate including a first transmission area and a display area around the first transmission area, the pixel layer overlapping the display area; providing a second substrate facing the first substrate, the second substrate including a second transmission area overlapping the first transmission area; providing a transparent material between the first transmission area and the second transmission area; and melting each of a portion of the first transmission area adjacent to the transparent material, the transparent material, and a portion of the second transmission area adjacent to the transparent material to form a connection portion that connects the first transmission area and the second transmission area.

Embodiments provide a method of manufacturing a display device. The method includes providing a first transparent substrate including a first transmission area and a display area around the first transmission area; providing a second transparent substrate facing the first transparent substrate and including a second transmission area overlapping the first transmission area; and providing a laser beam onto the first transmission area and melting at least a portion of the first transmission area to form a connection portion that connects the first transmission area and the second transmission area.

Embodiments provide a display device including a first substrate including a first substrate including a first transmission area and a display area around the first transmission area; a pixel layer disposed on the first substrate and overlapping the display area; a second substrate facing the first substrate and comprising a second transmission area overlapping the first transmission area; and a connection portion disposed between the first transmission area and the second transmission area, wherein the first transmission area adjacent to the connection portion, the connection portion, and the second transmission area adjacent to the connection portion comprise: a first portion having a first property; and a second portion having a second property different from the first property, and wherein the first portion has an area greater than an area of the second portion.

According to one or more of the embodiments, the light transmittance of the area overlapping the sensor may be improved due to the light-transmitting connection portion disposed between the first transmission area and the second transmission area.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
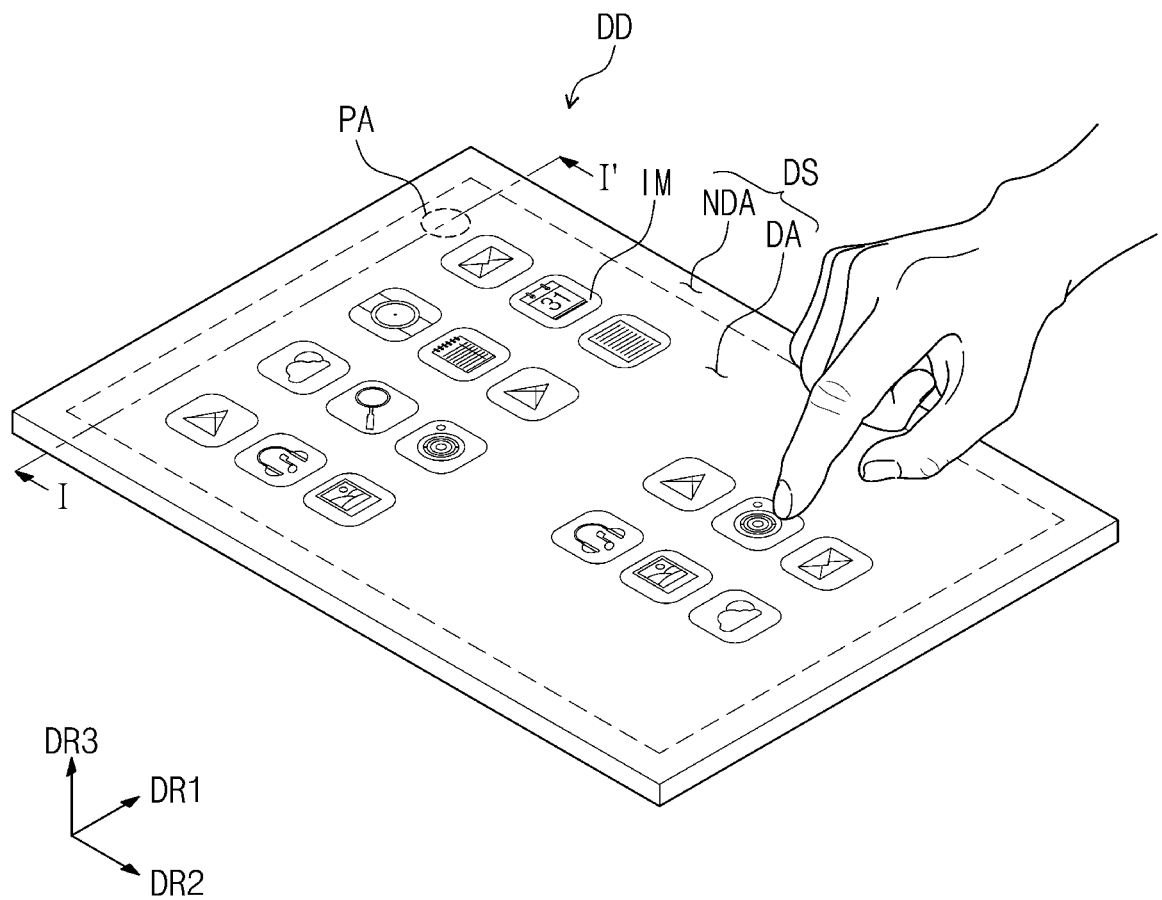
FIG. 1 is a perspective view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the present disclosure, it will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "directly on," "directly connected to" or "directly coupled to" another element or layer, no intervening elements or layers are present.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, the singular forms, "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be explained in detail with reference to the accompanying drawings.

FIG. 1 is a perspective view showing an embodiment of a display device DD.

Referring to FIG. 1, the display device DD may have a rectangular planar shape defined by short sides extending along a first direction DR1 and long sides extending along a second direction DR2 which crosses the first direction DR1, however, should not be limited thereto or thereby. The display device DD may have a variety of planar shapes, such as a circular shape or a polygonal shape.

Hereinafter, a direction that is substantially perpendicular to a plane defined by the first direction DR1 and the second direction DR2 crossing each other, may be referred to as a third direction DR3. In the following descriptions, the expression "when viewed in a plane" or "a plan view" may mean a state of being viewed along the third direction DR3.

An upper surface of the display device DD may be defined as a display surface DS and may be in a plane parallel to a plane defined by the first direction DR1 and the second direction DR2 crossing each other. An image IM generated by the display device DD may be provided to outside the display device DD (e.g., such as to a user of the display device DD) through the display surface DS.

The display surface DS may include a display area DA and a non-display area NDA which is adjacent to the display area DA. The display area DA may be a planar area at which the image IM is displayed or is visible from outside the display device DD, and the non-display area NDA may be a planar area at which the image IM is not displayed or not visible from outside the display device DD. In an embodiment, the non-display area NDA may surround the display area DA and may define a bezel of the display device DD. In embodiments, various components or layers of the display device DD may include a display area DA and a non-display area NDA corresponding to those described above for the display device DD.

The display area DA may include a transmission area PA. When viewed in a plane, the transmission area PA may have a circular planar shape. The display area DA may surround the transmission area PA in a plan view. A sensor that provides a variety of functions of the display device DD may be arranged in the transmission area PA.

The display device DD may be applied to a large-sized electronic item, such as a television set, a display monitor or an outdoor billboard, and a small and medium-sized electronic item, such as a personal computer, a notebook computer, a personal digital assistant, a smartphone or a tablet computer. However, the above-mentioned electronic items are merely exemplary, and the display device DD may be applied to other electronic items without departing from the concept of the present disclosure.

Figure 2:
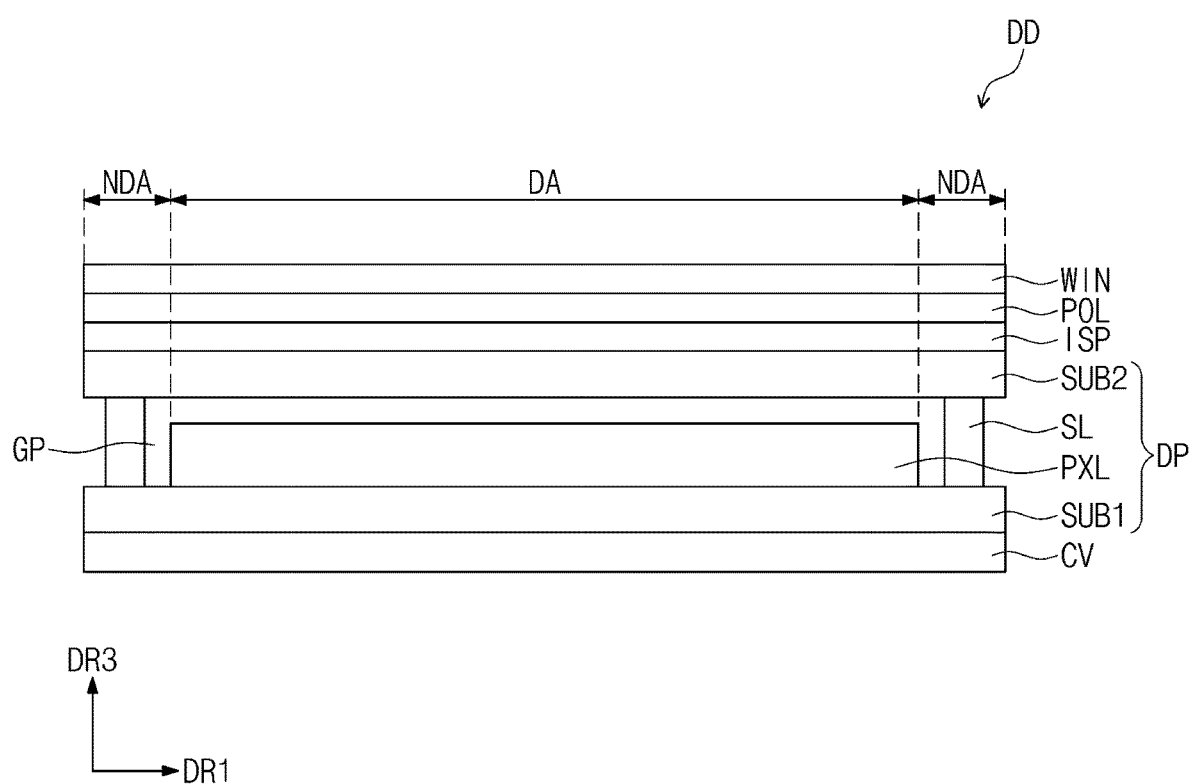
FIG. 2 is a cross-sectional view showing an embodiment of the display device in FIG. 1.

FIG. 2 is a cross-sectional view schematically showing an embodiment of the display device DD in FIG. 1. While FIG. 2 shows various components and layers of the display device DD with respect to the first direction DR1 and the third direction DR3, the cross-sectional structure may also be applied along the second direction DR2 and the third direction DR3, without being limited thereto.

Referring to FIG. 2, the display device DD may include a display panel DP, an input sensing unit ISP (e.g., input sensing layer) disposed on the display panel DP, an anti-reflective layer POL disposed on the input sensing unit ISP, a window WIN disposed on the anti-reflective layer POL, and a cover panel CV disposed under the display panel DP.

The display panel DP may be a light emitting type display panel, however, should not be particularly limited. In an embodiment, for example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as the display panel DP.

The display panel DP may include a first substrate SUB1, a second substrate SUB2 facing the first substrate SUB1, a pixel layer PXL as an image display layer, and a sealing portion SL (e.g., sealing layer or sealing member). The display panel DP may include a display area DA and a non-display area NDA which is adjacent to the display area DA.

The first substrate SUB1 may include a transparent substrate. In an embodiment, for example, the first substrate SUB1 may be a glass substrate as a first transparent substrate.

The pixel layer PXL may be disposed on the first substrate SUB1. The pixel layer PXL may include a plurality of circuit elements and a plurality of light emitting elements which are connected to the plurality of circuit elements. The pixel layer PXL will be described in detail later.

The second substrate SUB2 may include a transparent substrate. In an embodiment, for example, the second substrate SUB2 may be a glass substrate as a second transparent substrate. The second substrate SUB2 may be an encapsulation substrate.

The sealing portion SL may be disposed between the first substrate SUB1 and the second substrate SUB2. The sealing portion SL may combine the first substrate SUB1 with the second substrate SUB2. The sealing portion SL may be disposed along an edge of the first substrate SUB1 and the second substrate SUB2. The sealing portion SL may overlap or correspond to the non-display area NDA.

The sealing portion SL may define a gap GP between the first substrate SUB1 and the second substrate SUB2, together with the first substrate SUB1 and the second substrate SUB2. The gap GP may be filled with air or inert gas. The sealing portion SL may include an inorganic adhesive material such as frit, however, a material for the sealing portion SL should not be limited thereto or thereby. In an embodiment, for example, the sealing portion SL may include an organic adhesive material.

The second substrate SUB2 and the sealing portion SL may reduce or effectively prevent entry of moisture to the pixel layer PXL disposed on the first substrate SUB1, and thus, defects of the light emitting elements within the pixel layer PXL may be reduced or effectively prevented.

The input sensing unit ISP may be disposed on the second substrate SUB2. The input sensing unit ISP may sense an external input to the display device DD, e.g., a touch or contact, may convert the external input to an electronic input signal, and may provide the electronic input signal to the display panel DP. The input sensing unit ISP may include a plurality of sensing electrodes to sense the external input. The sensing electrodes may sense the external input by a capacitive method. The display panel DP may receive the input signal from the input sensing unit ISP and may generate an image IM corresponding to the input signal.

The anti-reflective layer POL may be disposed on the input sensing unit ISP. The anti-reflective layer POL may reduce a reflectance of an external light incident to the display panel DP from outside of the display device DD. As an example, the anti-reflective layer POL may include a retarder and/or a polarizer.

The window WIN may protect the display panel DP and the input sensing unit ISP from external scratches and impacts. The window WIN may be attached to the input sensing unit ISP by an adhesive material layer (not shown). The adhesive material layer may include an optically clear adhesive material. The image IM generated by the display panel DP may be provided to the outside of the display device DD through the window WIN. The window WIN may form an outer surface of the display device DD. In an embodiment, the window WIN may provide the display surface DS of the display device DD, without being limited thereto.

The cover panel CV may be disposed under the display panel DP. That is, the cover panel CV may face the window WIN with the display panel DP therebetween. The cover panel CV may include one or more functional layers. In an embodiment, for example, the cover panel CV may include a cushioning layer including a cushion material. The cushioning layer may be a synthetic resin foam that includes a matrix member and a plurality of voids which are in the matrix member. The voids may absorb impacts applied to the display panel DP.

Figure 3:
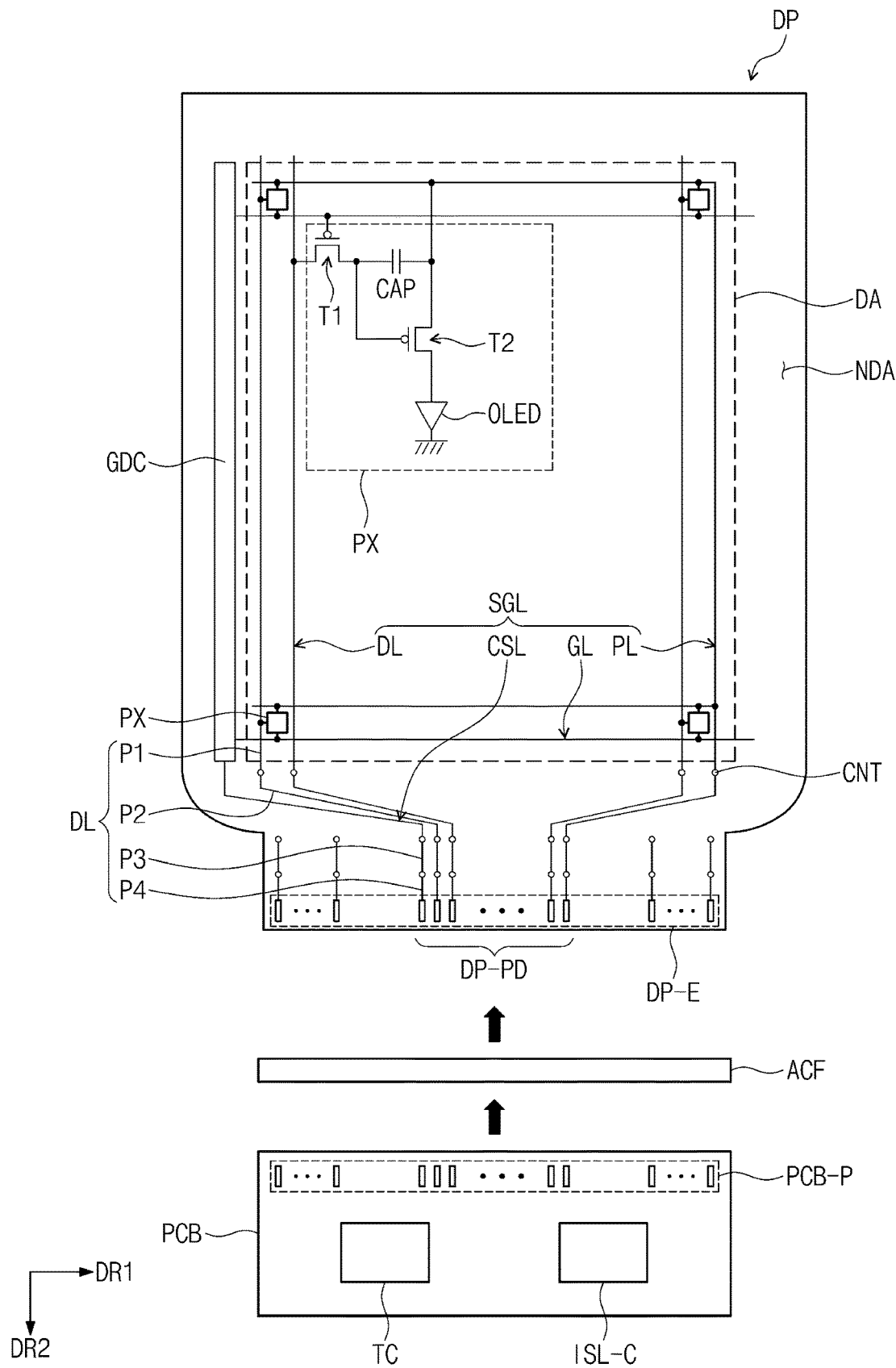
FIG. 3 is a plan view showing an embodiment of a display panel in FIG. 2.

FIG. 3 is a plan view showing an embodiment of the display panel DP in FIG. 2. The second substrate SUB2 is omitted from FIG. 3 for convenience of illustration.

Referring to FIG. 3, the display panel DP may include a driving circuit GDC, a plurality of signal lines SGL, a plurality of signal pads DP-PD, and a pixel PX provided in plural including a plurality of pixels PX.

The driving circuit GDC may include a scan driving circuit. The scan driving circuit may generate a plurality of scan signals as electrical signals and may sequentially output the scan signals to a scan line GL provided in plural including a plurality of scan lines GL described later. The scan driving circuit may further output other control signals as electrical signals to the pixel driving circuit of the pixels PX.

The scan driving circuit may include a plurality of thin film transistors provided or formed through the same processes, e.g., a low temperature polycrystalline silicon ("LTPS") process or a low temperature polycrystalline oxide ("LTPO") process, as layers or elements of the pixel driving circuit of the pixels PX.

The signal lines SGL may include the scan lines GL, a data line DL provided in plural including a plurality of data lines DL, a power line PL, and a control signal line CSL. Each of the scan lines GL may be connected to a corresponding one of the pixel PX among the pixels PX, and each of the data lines DL may be connected to a corresponding one of the pixel PX among the pixels PX. The power line PL may be connected to the pixels PX. The control signal line CSL may provide the scan driving circuit with control signals.

The signal lines SGL may include a plurality of portions disposed in different layers from each other, among layers on the first substrate SUB1. FIG. 3 shows a data line DL includes four portions P1, P2, P3 and P4. The four portions P1, P2, P3 and P4 may be variously connected to each other via one or more of a contact hole CNT. Along a length of the data line DL, the four portions P1, P2, P3 and P4 may be arranged in order.

The signal pads DP-PD may be variously connected to the data lines DL, the power line PL, and the control signal line CSL. The signal pads DP-PD may be disposed to be adjacent to each other in a pad area DP-E of the display panel DP. The pad area DP-E may be defined in a portion of the non-display area NDA. The stacked structures or constituent materials of the signal pads DP-PD are not distinguished from one another for convenience of illustration, and the signal pads DP-PD may be provided or formed through the same process.

The display area DA may overlap or correspond to the planar area in which the pixels PX are arranged. That is, the pixels PX are in the display area DA. A plurality of electronic elements is arranged in the display area DA. The electronic elements may include a light emitting element and the pixel driving circuit which is connected to the light emitting element. Each of the pixels PX may include the light emitting element and the pixel driving circuit.

The pixel PX may include, for example, a first transistor T1, a second transistor T2, a capacitor CAP, and a light emitting element OLED as a display element. The pixel driving circuit may include the first transistor T1, the second transistor T2 and the capacitor CAP. It is sufficient that the pixel driving circuit includes a switching transistor and a driving transistor, but the pixel driving circuit should not be limited thereto or thereby. The first transistor T1 may be connected to the scan line GL and the data line DL. The light emitting element OLED may receive a power voltage as an electrical signal which is provided through the power line PL.

FIG. 3 further shows a circuit board PCB electrically connected to the display panel DP. The circuit board PCB may be a rigid circuit board or a flexible circuit board.

A timing control circuit TC (e.g., timing controller) may be disposed on the circuit board PCB to control an operation of the display panel DP. In addition, an input sensing circuit ISL-C may be disposed on the circuit board PCB to control an input sensor. Each of the timing control circuit TC and the input sensing circuit ISL-C may be mounted on the circuit board PCB in an integrated chip form. In an embodiment, the timing control circuit TC and the input sensing circuit ISL-C may be mounted on the circuit board PCB in one integrated chip.

The circuit board PCB may include circuit board pads PCB-P in a circuit board pad area, which are electrically connected to the signal pads DP-PD of the display panel DP. That is, the circuit board PCB is electrically connected to the display panel DP at the signal pads DP-PD thereof. Although not shown in figures, the circuit board PCB may further include signals lines (e.g., conductive lines) that connect the circuit board pads PCB-P and the timing control circuit TC and/or the input sensing circuit ISL-C, respectively to each other. In addition, the circuit board pads PCB-P of the circuit board PCB may be output pads through which an electrical signal is transmitted out of the circuit board PCB and into the display panel DP, and the circuit board PCB may further include input pads through which the electrical signal transmits into the display panel DP from the circuit board PCB.

The signal pads DP-PD of the display panel DP may be electrically connected to the circuit board pads PCB-P by a conductive member, such as an anisotropic conductive film ACF (e.g., anisotropic conductive layer). In an embodiment, the anisotropic conductive film ACF may be replaced with another conductive member such as a conductive ball.

Figure 4:
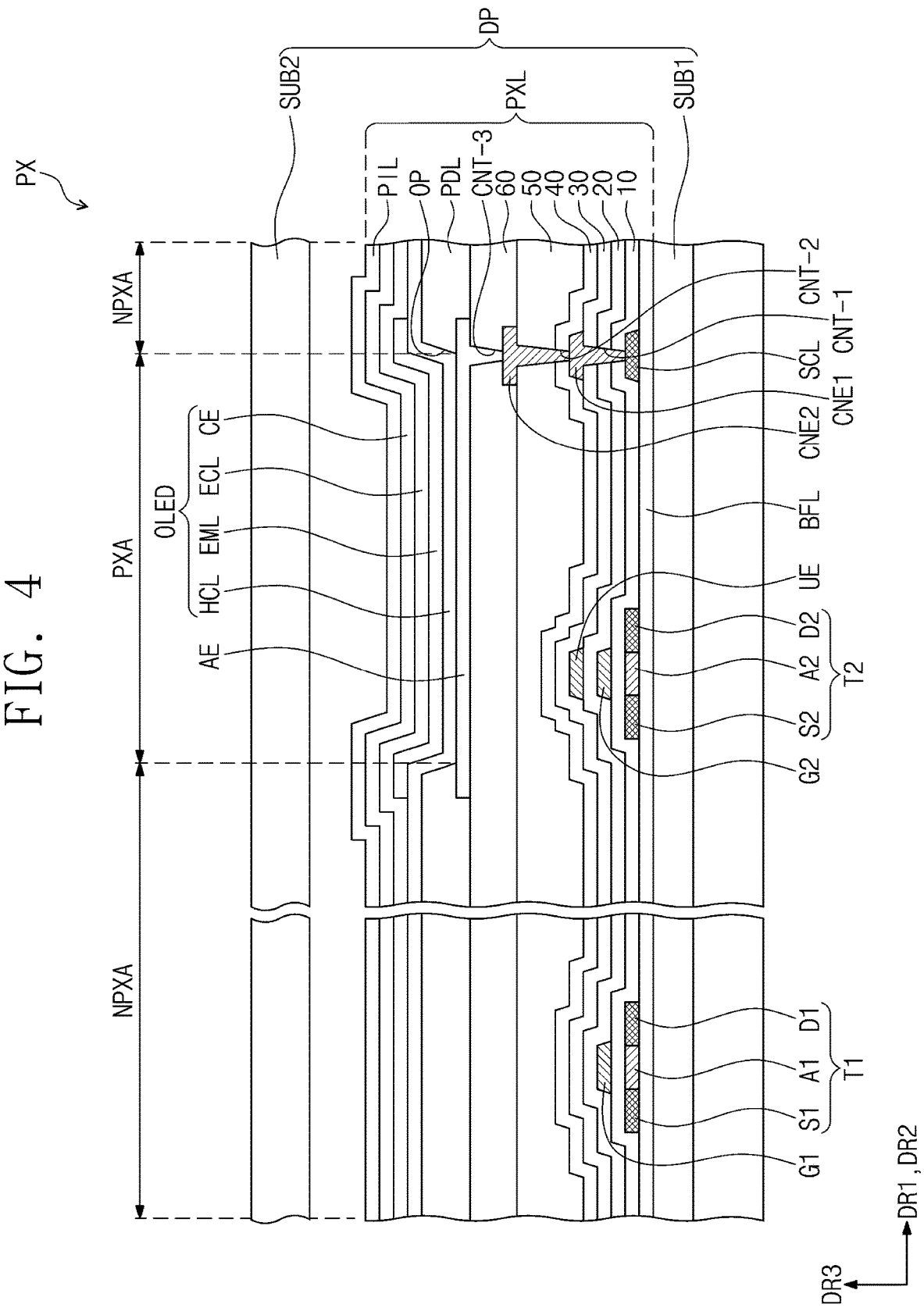
FIG. 4 is a cross-sectional view showing an embodiment of a pixel in FIG. 3.

FIG. 4 is an enlarged cross-sectional view showing an embodiment of the pixel PX in FIG. 3.

The pixel layer PXL in FIG. 2 will be described in detail with reference to FIG. 4.

The display area DA may include a plurality of pixel areas PXA and a non-pixel area NPXA which is adjacent to each of the pixel areas PXA. FIG. 4 shows only one of the pixel area PXA, however, the pixel area PXA may be provided in plural including the pixel areas PXA. In an embodiment, the non-pixel area NPXA may be disposed to surround each of the pixel areas PXA.

The pixel layer PXL may include a buffer layer BFL, the first transistor T1, the second transistor T2, a first insulating layer 10, a second insulating layer 20, a third insulating layer 30, a fourth insulating layer 40, a fifth insulating layer 50, a sixth insulating layer 60, a first connection electrode CNE1, a second connection electrode CNE2, a light emitting element OLED and a protective layer PIL.

The buffer layer BFL may improve a coupling force between the first substrate SUB1 and a semiconductor pattern of a switching element, such as a transistor. The buffer layer BFL may include a silicon oxide material layer and a silicon nitride material layer. The silicon oxide material layer and the silicon nitride material layer may be stacked upon in each other along the third direction DR3.

The semiconductor pattern may be disposed on the buffer layer BFL. The semiconductor pattern may include polysilicon, however, should not be limited thereto or thereby. The semiconductor pattern may include amorphous silicon or metal oxide. The semiconductor pattern may be provided in plural within a semiconductor layer on the first substrate SUB1. The semiconductor patterns may be in a same layer as each other, among layers on the first substrate SUB1. As being "in a same layer," elements or patterns may be respective portions of a same material layer.

A first source S1, a first active region A1 and a first drain D1 of the first transistor T1 may be provided or formed from a same one of the semiconductor pattern, and a second source S2, a second active region A2 and a second drain D2 of the second transistor T2 may be provided or formed from a same one of the semiconductor pattern. In a direction along the first substrate SUB1, the first source S1 and the second source S2 may respectively extend from the first active region A1 and the second active region A2 in a direction opposite to a direction in which the first drain D1 and the second drain D2 respectively extend from the first active region A1 and the second active region A2, in the cross-section. FIG. 4 shows a portion of a connection signal line SCL provided or formed from a semiconductor pattern within the semiconductor layer. Although not shown separately, the connection signal line SCL may be connected to the second drain D2 of the second transistor T2 when viewed in a plane.

The first insulating layer 10 may be disposed on the buffer layer BFL. The first insulating layer 10 may commonly overlap the pixels PX and may cover the semiconductor pattern. The first insulating layer 10 may include an inorganic material layer and/or an organic material layer, and may have a single-layer structure or multi-layer structure. The first insulating layer 10 may include at least one of aluminum oxide, titanium oxide, silicon oxide, silicon oxynitride, zirconium oxide and hafnium oxide. In an embodiment, the first insulating layer 10 may be a single layer of silicon oxide material.

A first gate G1 and a second gate G2 may be disposed on the first insulating layer 10. The first gate G1 and the second gate G2 may be respective portions of a same metal material layer (e.g., a gate metal pattern). The first gate G1 and the second gate G2 overlap the first active region A1 and the second active region and A2, respectively. In an embodiment of manufacturing the display device DD, the first gate G1 and the second gate G2 may act as a mask in a doping process of the semiconductor patterns within the semiconductor layer.

The second insulating layer 20 may be disposed on the first insulating layer 10 to cover the first gate G1 and the second gate G2 of the gate metal pattern. The second insulating layer 20 may commonly overlap the pixels PX. The second insulating layer 20 may include an inorganic material layer and/or an organic material layer, and may have a single-layer structure or multi-layer structure. In an embodiment, the second insulating layer 20 may be a single layer of silicon oxide material.

An upper electrode UE may be disposed on the second insulating layer 20. The upper electrode UE may overlap the second gate G2 of the second transistor T2. The upper electrode UE may be a portion of a metal pattern. The second gate G2 and the upper electrode UE facing the second gate G2 may define the capacitor CAP (refer to FIG. 3). In an embodiment, the upper electrode UE may be omitted.

The third insulating layer 30 may be disposed on the second insulating layer 20 to cover the upper electrode UE. In an embodiment, the third insulating layer 30 may be a single layer of silicon oxide material. The first connection electrode CNE1 may be disposed on the third insulating layer 30. The first connection electrode CNE1 may be connected to the connection signal line SCL at or through a first contact hole CNT-1 penetrating through a thickness of each of the first insulating layer 10, the second insulating layer 20 and the third insulating layer 30.

The fourth insulating layer 40 may be disposed on the third insulating layer 30. The fourth insulating layer 40 may be a single layer of silicon oxide material. The fifth insulating layer 50 may be disposed on the fourth insulating layer 40. The fifth insulating layer 50 may be an organic material layer. The second connection electrode CNE2 may be disposed on the fifth insulating layer 50. The second connection electrode CNE2 may be connected to the first connection electrode CNE1 at or through a second contact hole CNT-2 penetrating through a thickness of each of the fourth insulating layer 40 and the fifth insulating layer 50.

The sixth insulating layer 60 may be disposed on the fifth insulating layer 50 to cover the second connection electrode CNE2. The sixth insulating layer 60 may be an organic material layer.

The light emitting element OLED may be disposed on the sixth insulating layer 60. A first electrode AE of the light emitting element OLED may be connected to the second connection electrode CNE2 at or through a third contact hole CNT-3 penetrating through at thickness of the sixth insulating layer 60. A pixel opening OP may be provided in plural including a plurality of pixel openings OP which are defined through a pixel definition layer PDL. The first electrode AE may be exposed to outside the pixel definition layer PDL, through the pixel opening OP of the pixel definition layer PDL.

The pixel definition layer PDL may be disposed on the sixth insulating layer 60. The pixel definition layer PDL may overlap or correspond to the non-pixel area NPXA. The plurality of pixel openings OP may be defined through the pixel definition layer PDL to respectively overlap or correspond to the pixel areas PXA.

The light emitting element OLED may be provided in plural including a plurality of light emitting elements OLED which are respectively in the pixel openings OP defined through the pixel definition layer PDL. The light emitting elements OLED may respectively include each of the first electrode AE, a hole control layer HCL, a light emitting layer EML (e.g., light emitting pattern), an electron control layer ECL and a second electrode CE.

The hole control layer HCL may be commonly disposed in the pixel area PXA and the non-pixel area NPXA. The hole control layer HCL may include a hole transport material layer and may further include a hole injection material layer. The light emitting layer EML may be disposed on the hole control layer HCL. The light emitting layer EML may be disposed in a planar area corresponding to the pixel opening OP. That is, the light emitting layer EML may be provided or formed in each of the pixels PX after being divided into plural portions or patterns which together form the light emitting layer EML.

The electron control layer ECL may be disposed on the light emitting layer EML. The electron control layer ECL may include an electron transport material layer and may further include an electron injection material layer. The hole control layer HCL and the electron control layer ECL may be commonly provided or formed in the plurality of the pixels PX, such as using an open mask in a method of manufacturing the display device DD. The second electrode CE may be disposed on the electron control layer ECL. The second electrode CE may have a single unitary form and may be commonly disposed in each of the plural pixels PX.

The protective layer PIL may be disposed on the second electrode CE. The protective layer PIL may include an inorganic material. In an embodiment, for example, the protective layer PIL may include silicon oxide, silicon nitride or silicon oxynitride.

Figure 5:
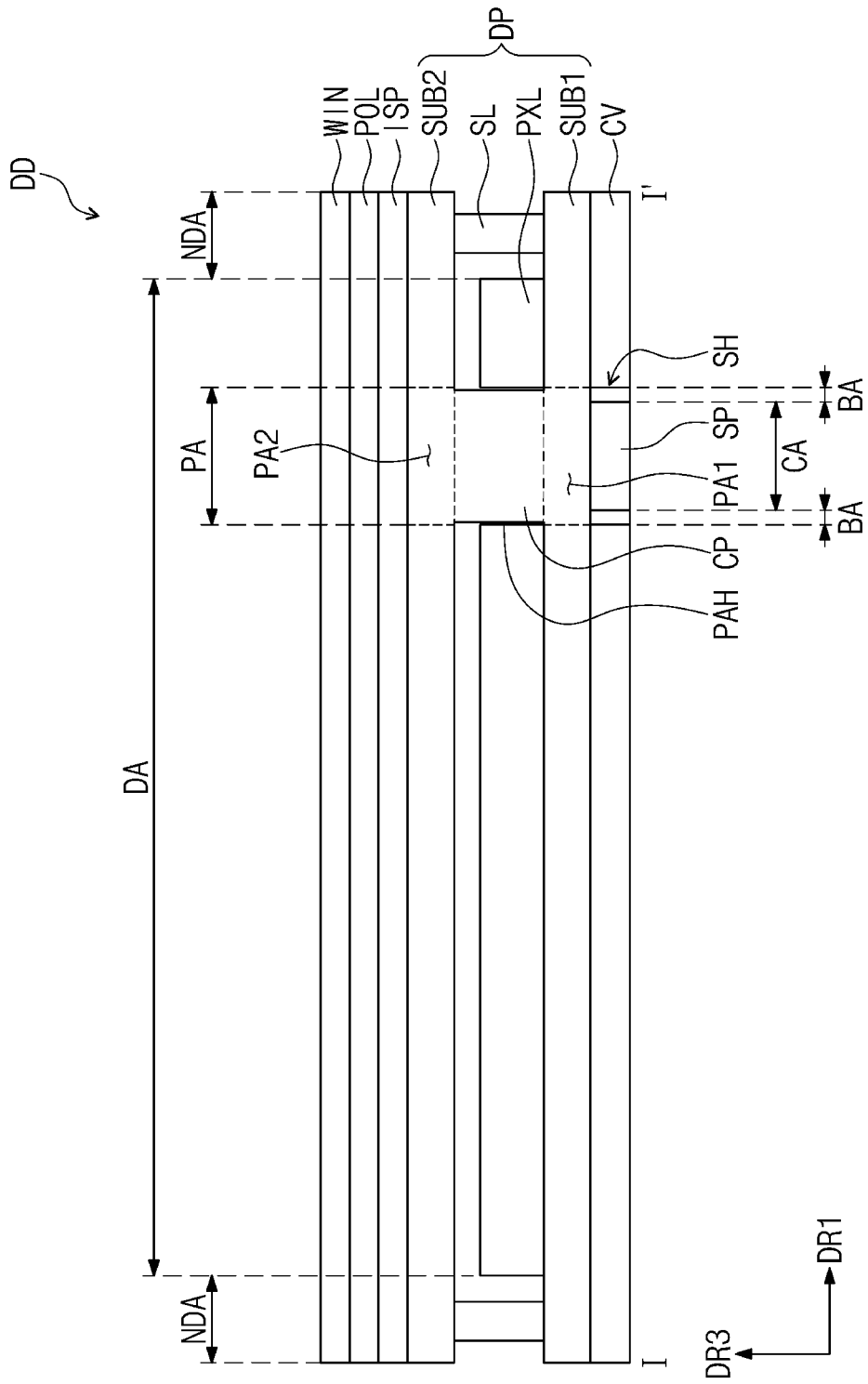
FIG. 5 is a cross-sectional view taken along line I-I' in FIG. 1.

FIG. 5 is a cross-sectional view taken along line I-I' shown in FIG. 1. For convenience of explanation, the pixel layer PXL will be schematically shown.

Referring to FIG. 5, the display panel DP may include a display area DA, a transmission area PA with the display area DA where portions of the display area are adjacent to the transmission area PA, and a non-display area NDA adjacent to the display area DA. Taking FIGS. 1 and 5 together, a first portion of the display area DA, the transmission area PA and a second portion of the display area DA are disposed in order along the first direction DR1 and/or the second direction DR2.

The first substrate SUB1 may include a first transmission area PA1 at which light transmits through the first substrate SUB1. The first transmission area PA1 may be defined as a planar area of the first substrate SUB1 which overlaps or corresponds to the transmission area PA of the display device DD.

The second substrate SUB2 may include a second transmission area PA2 at which light transmits through the second substrate SUB2. The second transmission area PA2 may be aligned with the first transmission area PA1 along the third direction DR3. The second transmission area PA2 may be defined as a planar area of the second substrate SUB2 which overlaps or corresponds to the transmission area PA of the display device DD.

A transmission hole PAH may be defined through a thickness of the pixel layer PXL. Portions of the pixel layer PXL may define the transmission hole PAH. The transmission hole PAH may be substantially an empty space (e.g., excluding a filler material, air, gas, etc.).

The transmission hole PAH may overlap or correspond to the transmission area PA. When viewed in a plane, the transmission hole PAH may have a circular planar shape, but is not limited thereto.

The display panel DP may include a connection portion CP (e.g., light-transmitting connection portion) disposed between the first substrate SUB1 and the second substrate SUB2. The connection portion CP may combine the first substrate SUB1 with the second substrate SUB2. The connection portion CP may be coplanar with the image display layer. That is, the sealing portion SL, together with the connection portion CP, may couple the first substrate SUB1 to the second substrate SUB2. The connection portion CP may overlap or correspond to the transmission area PA of the display device DD. When viewed in a plane, the connection portion CP may have a circular planar shape, but it not limited thereto.

The connection portion CP may extend to the second transmission area PA2 of the second substrate SUB2 from the first transmission area PA1 of the first substrate SUB1, via the transmission hole PAH. That is, the connection portion CP extends through the transmission hole PAH at the transmission area PA.

The connection portion CP may include a transparent material through which light is transmittable. The connection portion CP may include a glass material as the transparent material. In an embodiment, for example, the connection portion CP may include silicon oxide (SiOx), silicon nitride (SiNx), zinc oxide (ZnOx), or the like. A process of providing or forming the connection portion CP between the first substrate SUB1 and the second substrate SUB2 will be described later.

A sensor hole SH may be defined through a thickness of the cover panel CV. The sensor hole SH may overlap or correspond to the transmission area PA. A sensor portion SP may be disposed in the sensor hole SH. The sensor portion SP may include a sensor among various sensors which provide a function of the display device DD. In an embodiment, for example, the sensor portion SP may be a front camera which uses light and provides an image-capturing function of the display device DD. The sensor may provide the function of the display device DD by using light. In an embodiment, the light may be transmitted from outside the display device DD, to the sensor, through various layers of the display device DD at the transmission area PA. In an embodiment, the light may be transmitted to outside the display device DD, from the sensor, through the various layers of the display device DD at the transmission area PA.

The transmission area PA may include a center area CA and a peripheral area BA. The center area CA may overlap or correspond to the sensor portion SP, and the peripheral area BA may overlap or correspond to a planar area between the sensor portion SP and a side surface of the cover panel CV which defines the sensor hole SH. The transmission area PA may include a boundary between the center area CA and the peripheral area BA. The boundary may correspond to an edge of the center area CA.

Figure 6:
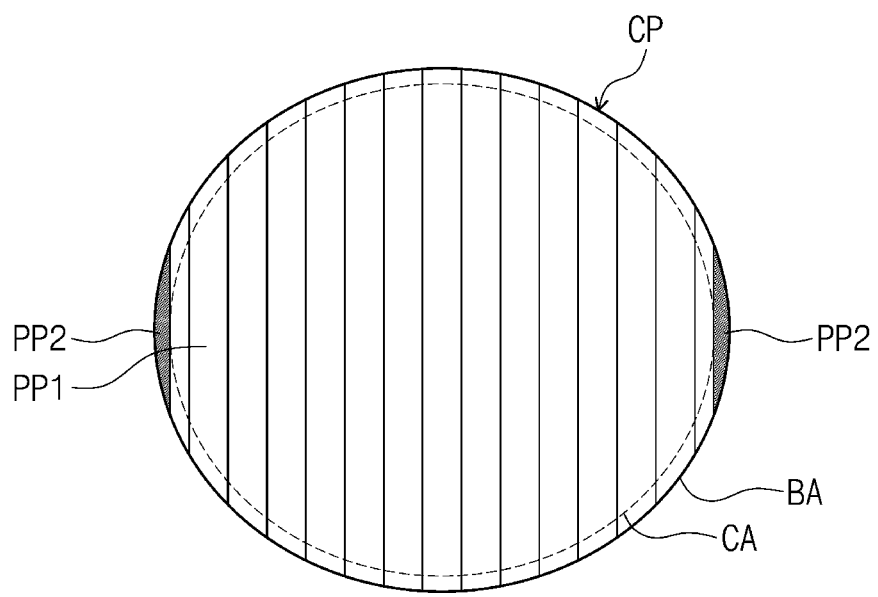
FIG. 6 is an enlarged plan view showing an embodiment of a cut surface of a connection portion in FIG. 5.
Figure 6:
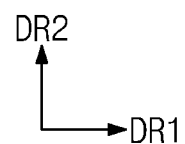

FIG. 6 is a plan view showing an embodiment of a surface (e.g., a cut surface) of the connection portion CP in FIG. 5. The cut surface of the connection portion CP shown in FIG. 6 may be substantially parallel to the first substrate SUB1 and the second substrate SUB2. The cut surface of the connection portion CP shown in FIG. 6 may be substantially parallel to a plane defined by the first direction DR1 and the second direction DR2 crossing each other. The cut surface of the connection portion CP shown in FIG. 6 may overlap or correspond to the center area CA and the peripheral area BA of the transmission area PA. That is, a total planar area of the cut surface of the connection portion CP may correspond to a sum of a planar area of the center area CA and a planar area of the peripheral area BA, and/or to a total planar area of the transmission area PA, without being limited thereto.

Referring to FIG. 6, the connection portion CP may include a first portion PP1 (e.g., first cross-section pattern portion) and a second portion PP2 (e.g., second cross-section pattern portion). The connection portion CP may have a pattern. The pattern may include a plurality of straight lines. Referring to FIG. 6, the straight lines may each extend along the second direction DR2 and may be spaced apart from each other along the first direction DR1. A process of forming the pattern of the connection portion CP will be described later.

Along a single direction, the second portion PP2 may be disposed at a leftmost edge and a rightmost edge (based on FIG. 6) of the cut surface of the connection portion CP. The second portion PP2 may overlap or correspond to the peripheral area BA. Referring to FIG. 6, for example, a total planar area of the second portion PP2 may be defined by an entirety of the peripheral area BA along the first direction DR1 between an edge of the center area CA and an outer edge of the connection portion CP, which is extended along the second direction DR2 crossing the first direction DR1.

The first portion PP1 may correspond to a planar area except for the planar area of the second portion PP2 of the cut surface of the connection portion CP. The first portion PP1 may overlap or correspond to the center area CA and a portion of the peripheral area BA. Referring to FIG. 6, for example, a total planar area of the first portion PP1 may be defined by an entirety of the connection portion CP along the first direction DR1 between the opposing edges of the center area CA, which is extended along the second direction DR2 crossing the first direction DR1.

When viewed in a plane, the first portion PP1 may have a total planar area greater than a total planar area of the second portion PP2.

The first portion PP1 may have a first property, and the second portion PP2 may have a second property which is different from the first property. In an embodiment, for example, each of the first portion PP1 and the second portion PP2 may have a light transmittance, and the light transmittance of the first portion PP1 may be higher than the light transmittance of the second portion PP2.

As the first portion PP1 overlaps or corresponds to the center area CA of the transmission area PA, the first portion PP1 may overlap the sensor portion SP. As the second portion PP2 overlaps the peripheral area BA, the second portion PP2 may overlap the area between the sensor portion SP and a side surface of the cover panel CV which defines the sensor hole SH.

According to the embodiment, at the transmission area PA, a space between the first substrate SUB1 and the second substrate SUB2 may be filled with a transparent material by the connection portion CP. Thus, a change in a refractive index along the third direction DR3 between the first substrate SUB1 and the second substrate SUB2 may be reduced or effectively prevented.

In addition, since only the first portion PP1 is disposed in the center area CA overlapping or corresponding to the sensor portion SP, the center area CA may have a uniform optical property (e.g., uniform transmittance). Accordingly, the transmittance of external light from outside the display device DD to the sensor portion SP may be improved.

Further, since the first substrate SUB1 is connected to the second substrate SUB2 by the connection portion CP, together with the sealing portion SL, the first substrate SUB1 and the second substrate SUB2 of the display panel DP may be stably coupled to each other, and thus, a durability of the display device DD may be improved.

However, the first portion PP1 and the second portion PP2 having different optical properties from each other may be provided or formed not only in the connection portion CP but also in another component or element of the display device DD. The first portion PP1 and the second portion PP2 may be provided or formed within the first substrate SUB1 at the first transmission area PA1 adjacent to the connection portion CP along the third direction DR3 and/or within the second substrate SUB2 at the second transmission area PA2 adjacent to the connection portion CP along the third direction DR3. The third direction DR3 may also indicate a light transmission direction, for example, from the window WIN to the sensor portion SP.

The pattern of the cut surface of the connection portion CP may be changed. In an embodiment, the pattern may be defined by a processing direction of a laser beam and a type of the laser beam, which are used to provide or form the first portion PP1 and the second portion PP2 of the connection portion CP.

Figure 7:
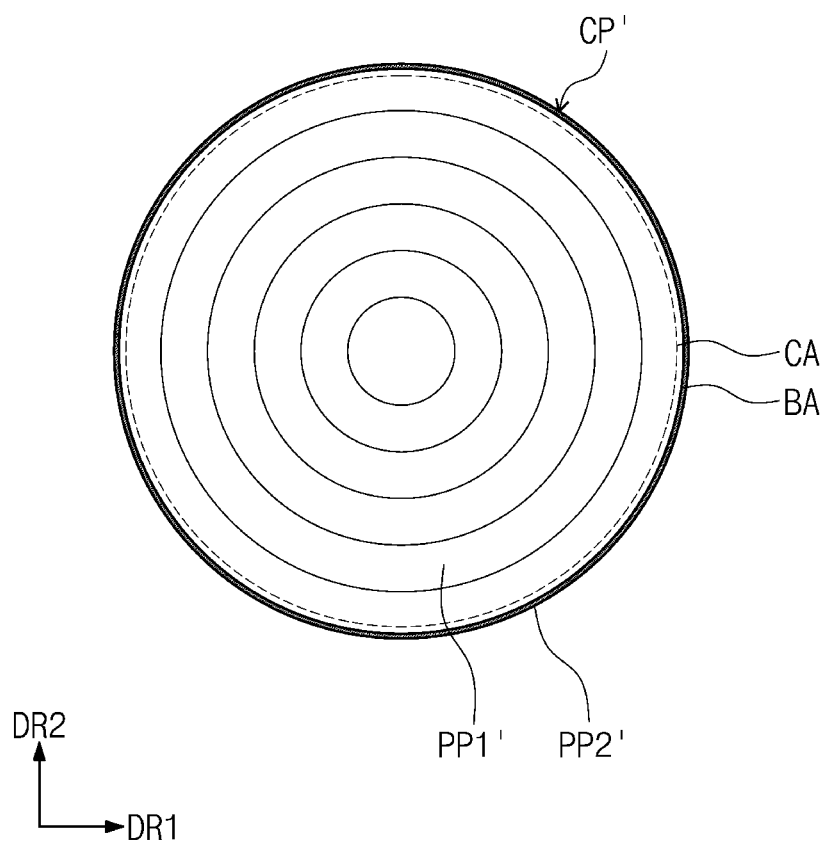
FIG. 7 is an enlarged plan view showing an embodiment of a cut surface of a connection portion of a display device.

FIG. 7 is a plan view showing an embodiment of a cut surface of a connection portion CP' of a display device DD.

Referring to FIG. 7, the connection portion CP' may include a first portion PP1' and a second portion PP2'. The connection portion CP' may have a pattern including a plurality of concentric circles defined in the cut surface. The cut surface may be substantially parallel to the first substrate SUB1 and the second substrate SUB2.

The second portion PP2' may be disposed at an outer edge of the cut surface of the connection portion CP'. In an embodiment, for example, the second portion PP2' may have a circular ring planar shape. The second portion PP2' may overlap or correspond to the peripheral area BA. A total planar area of the second portion PP2' may be less than a total planar area of the peripheral area BA.

The first portion PP1' may correspond to a planar area except for a planar area the second portion PP2' in the cut surface of the connection portion CP'. The first portion PP1' may overlap or correspond to the center area CA. The first portion PP1' may overlap a portion of the peripheral area BA. That is, a portion of the first portion PP1' may be between the edge of the center area CA and the second portion PP2'.

When viewed in a plan view, the first portion PP1' and the second portion PP2' may each have a total planar area, and the total planar area the first portion PP1' may be greater than the total planar area of the second portion PP2'.

The first portion PP1' may have a first property, and the second portion PP2' may have a second property which is different from the first property. In an embodiment, for example, each of the first portion PP1' and the second portion PP2' may have a light transmittance, and the light transmittance of the first portion PP1' may be higher than the light transmittance of the second portion PP2'.

The first portion PP1' may overlap or correspond to the center area CA of the transmission area PA of the display device DD. The second portion PP2' may overlap or correspond to the peripheral area BA. Consequently, the first portion PP1' may be disposed in a planar area of the connection portion CP' which overlaps or corresponds to the sensor portion SP.

As the first portion PP1' overlaps or corresponds to the center area CA, the first portion PP1' may overlap the sensor portion SP at the transmission area PA of the display device DD. As the second portion PP2' overlaps or corresponds to the peripheral area BA, the second portion PP2' may overlap the planar area between the sensor portion SP and a side surface of the cover panel CV which defines the sensor hole SH.

Consequently, since only the first portion PP1' having the higher light transmittance is disposed corresponding to the center area CA overlapping the sensor portion SP, the center area CA may have a uniform optical property. Accordingly, the transmittance of the external light to the sensor portion SP from outside the display device DD, may be improved.

Hereinafter, a method of providing the display device DD will be described.

Figure 8:
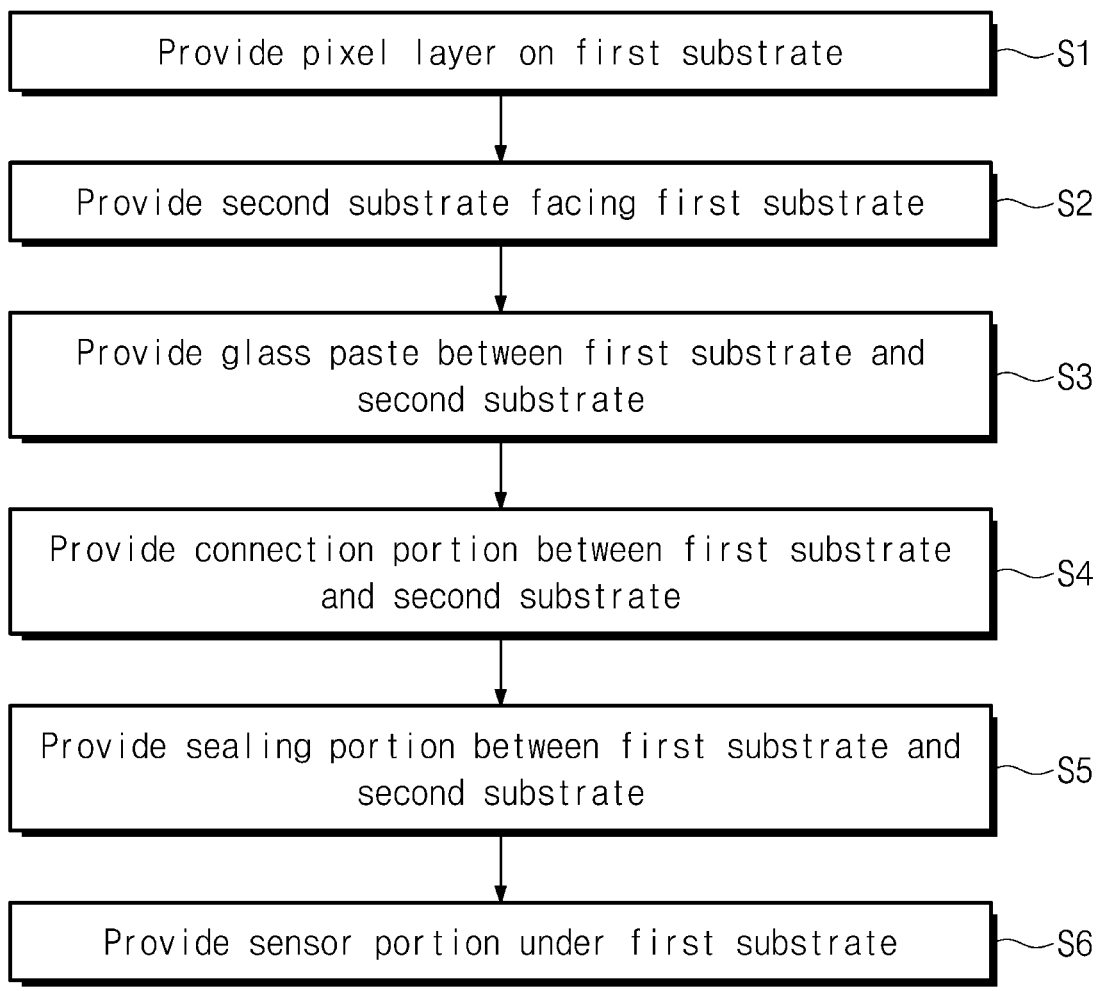
FIG. 8 is a flowchart showing an embodiment of a method of manufacturing a display device.

FIG. 8 is a flowchart showing an embodiment of a method of providing or manufacturing the display device DD.

FIGS. 9 to 12 are cross-sectional views showing structures in an embodiment of a method of providing or manufacturing the display device DD.

Figure 9:
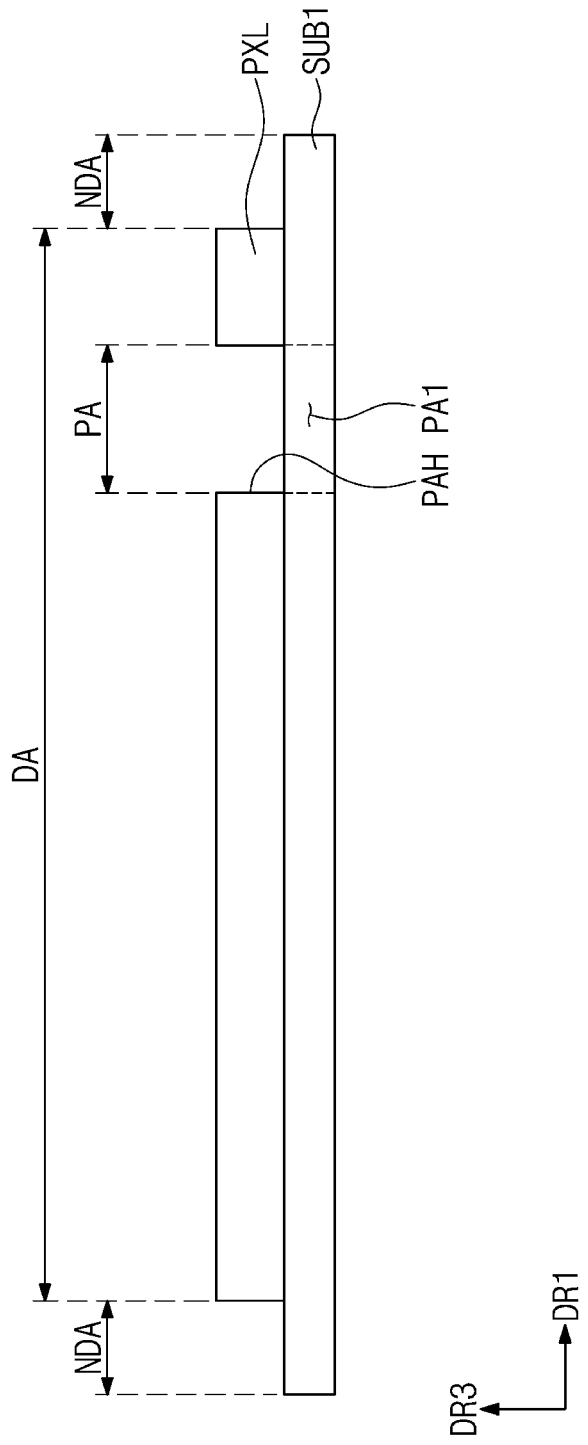
FIGS. 9 to 12 are cross-sectional views showing an embodiment of a method of providing a display device.

Referring to FIGS. 8 and 9, the pixel layer PXL is provided or formed on the first substrate SUB1 (S1). The pixel layer PXL may overlap or correspond to the display area DA. The pixel layer PXL may not be provided or formed in the first transmission area PA1 of the first substrate SUB1 which overlaps or corresponds to the transmission area PA. Accordingly, the transmission hole PAH may be defined through the thickness of the pixel layer PXL. The transmission hole PAH may overlap or correspond to the transmission area PA. The transmission hole PAH may be considered as transparent or light transmissive.

Figure 10:
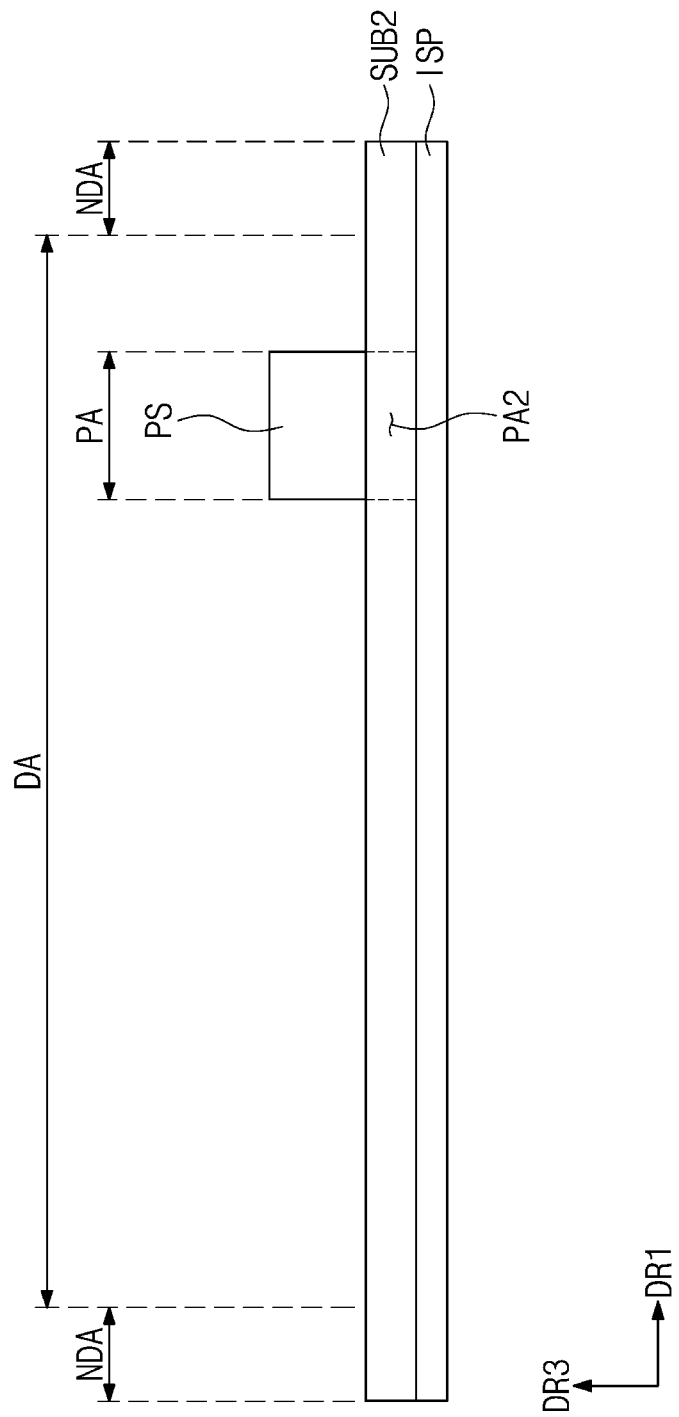
Figure 11:
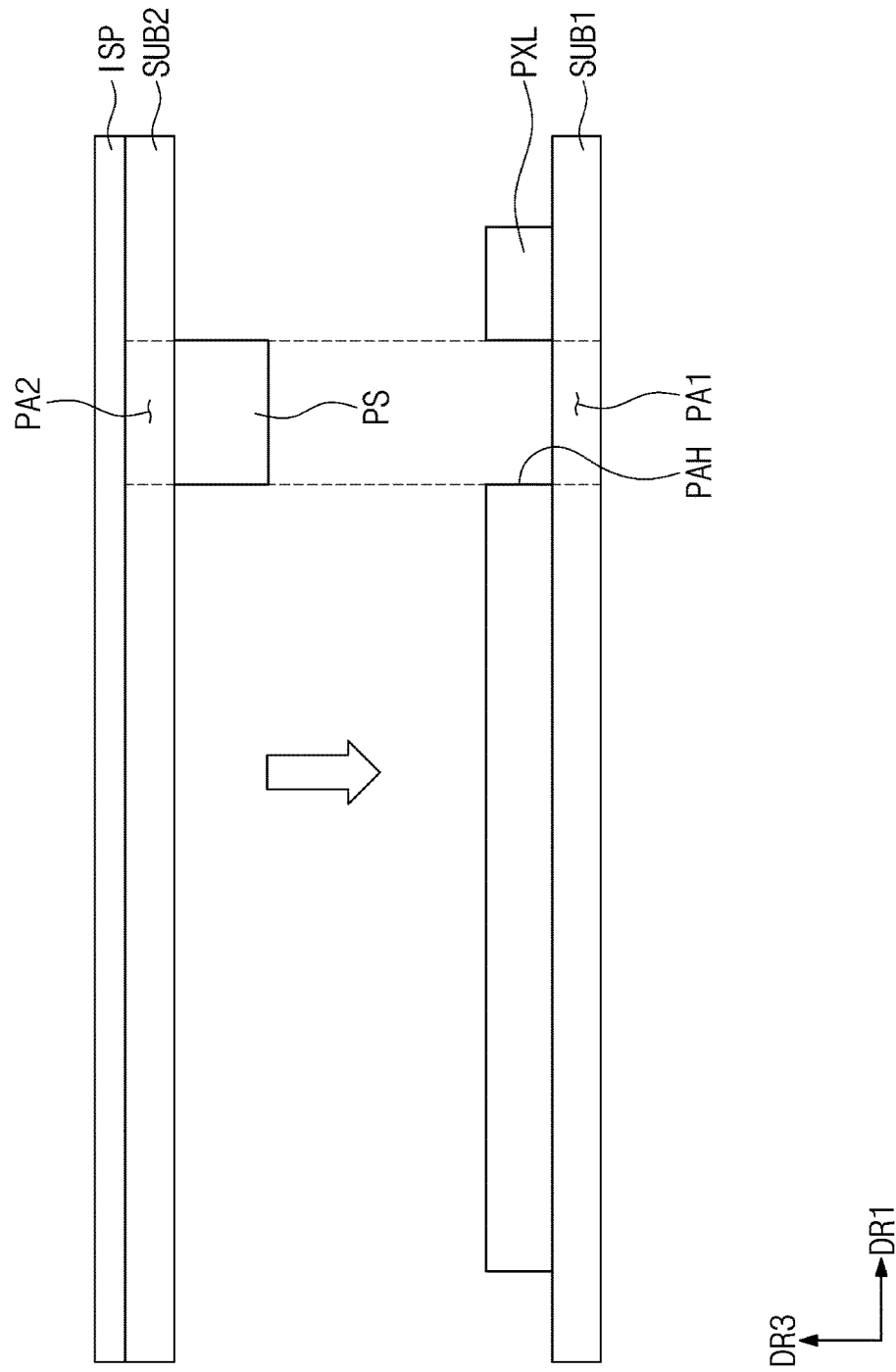

Referring to FIGS. 8, 10 and 11, the second substrate SUB2 is provided facing the first substrate SUB1 (S2). The providing of the second substrate SUB2 (S2) may include providing or forming the input sensing unit ISP on an upper surface of the second substrate SUB2. The input sensing unit ISP may be provided or formed directly on the upper surface of the second substrate SUB2, or may be subsequently attached to the upper surface of the second substrate SUB2 after being manufactured as a separate element. The second substrate SUB2 may be turned upside down to allow a lower surface thereof which is opposite to the upper surface thereof, to face upward after the providing or forming of the input sensing unit ISP.

A glass paste PS (e.g., transparent material) is provided between the first substrate SUB1 and the second substrate SUB2 which faces the first substrate SUB1 (S3). The glass paste PS is provided at a location along the first substrate SUB1 which corresponds to the first transmission area PA1. The glass paste PS may be considered a pattern of transparent material, without being limited thereto.

The providing of the glass paste PS (S3) may include printing the glass paste PS on a surface of the second substrate SUB2 at a location thereof corresponding to the second transmission area PA2 which face the first transmission area PA1 of the first substrate SUB1. The process of printing the glass paste PS on the second substrate SUB2 in the second transmission area PA2 may be performed by various methods. In an embodiment of providing the glass paste PS, a raw material of the glass paste PS may be provided on the second substrate SUB2 in the second transmission area PA2 thereof. The second substrate SUB2 including the raw material is heated. A heating temperature may be in a range from about 400 Celsius (° C.) to about 450° C. In an embodiment, for example, as the method of heating the second substrate SUB2 including the raw material which forms the glass paste PS, an electric heating method or a gas combustion heating method may be used. The raw material may be sintered by the heating process and may be converted into the glass paste PS. That is, the glass paste PS includes a raw material which has been sintered.

The glass paste PS may be attached to the second substrate SUB2. Additionally, a cooling process may be performed to reduce or effectively prevent cracking of the glass paste PS.

However, the process of printing the glass paste PS on the second substrate SUB2 should not be limited thereto or thereby. The glass paste PS may be printed on the second substrate SUB2 through other methods.

The glass paste PS may overlap or correspond to the transmission area PA of the display device DD. The providing of the glass paste PS (S3) may further include contacting the glass paste PS at the second transmission area PA2 of the second substrate SUB2 with the first substrate SUB1 at the first transmission area PA1 thereof. As used herein, elements which "contact" each other may form an interface therebetween.

The providing of the glass paste PS (S3) may further include insertion of the glass paste PS into the transmission hole PAH of the pixel layer PXL. The glass paste PS may be in contact with the first transmission area PA1 of the first substrate SUB1 through the transmission hole PAH of the pixel layer PXL. Each of the glass paste PS and the pixel layer PXL may have a thickness, and a thickness of the glass paste PS may be greater than the thickness of the pixel layer PXL. Accordingly, the first substrate SUB1 may be spaced apart from the second substrate SUB2 along the third direction DR3 at areas except for the transmission area PA.

Figure 12:
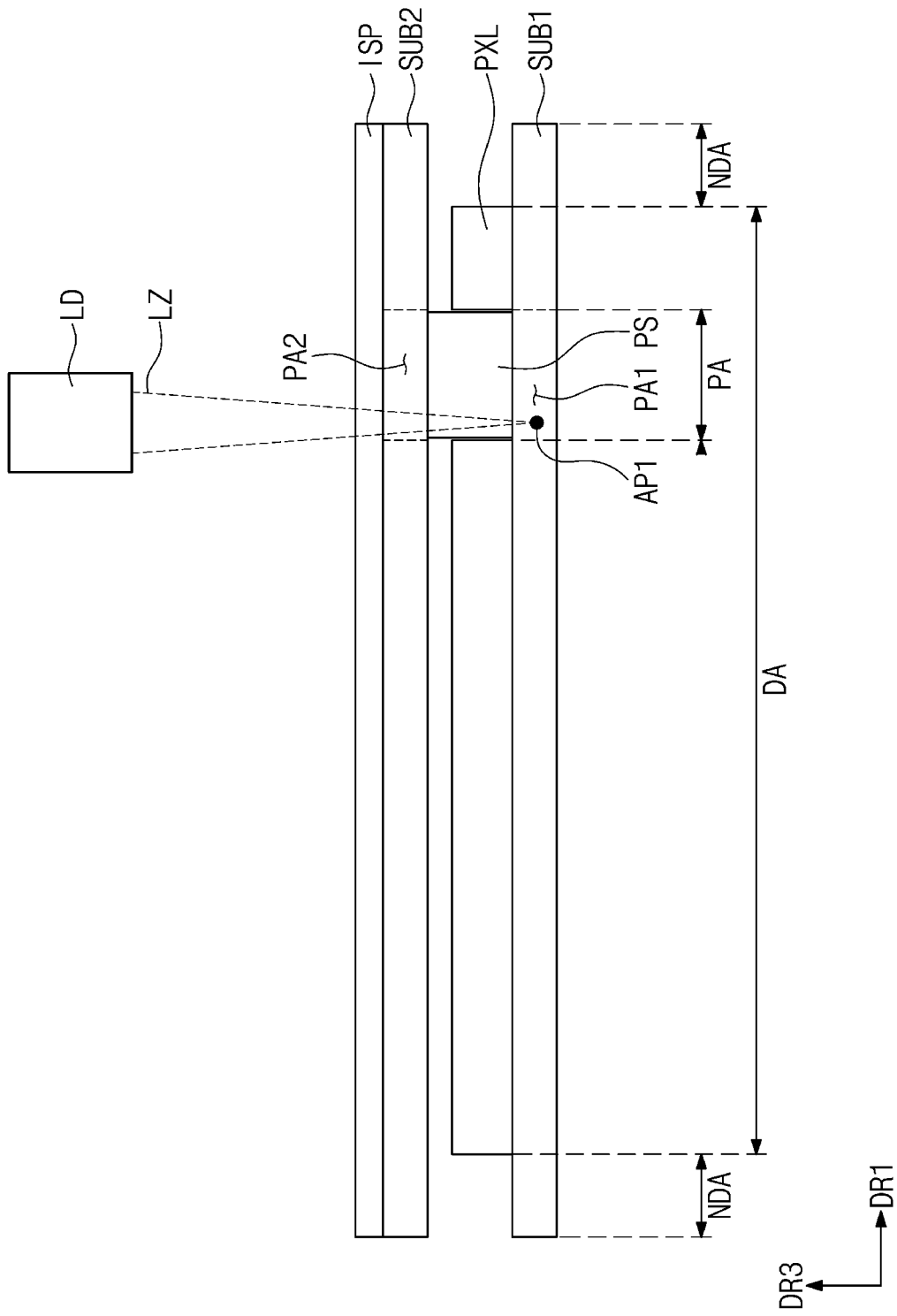

Referring to FIGS. 8 and 12, the connection portion CP (refer to FIG. 5) is providing or formed between the first substrate SUB1 and the second substrate SUB2 (S4). The providing of the connection portion CP may include melting each of a portion of the first substrate SUB1 at the first transmission area PA1 thereof which is adjacent to the glass paste PS along the third direction DR3, the glass paste PS, and a portion of the second substrate SUB2 at the second transmission area PA2 which is adjacent to the glass paste PS along the third direction DR3.

In the providing or forming of the connection portion CP (S4), a laser device LD may be used to provide or form the connection portion CP. The laser device LD may irradiate a laser beam LZ to a first point AP1 of the first substrate SUB1 which is within the first transmission area PA1 adjacent to the glass paste PS along the third direction DR3, and may melt the portion of the first transmission area PA1 adjacent to the glass paste PS together with the glass paste PS and the portion of the second transmission area PA2 adjacent to the glass paste PS, so that the connection portion CP may be provided or formed. The first point AP1 may be an arbitrary point of the first substrate SUB1 along the first transmission area PA1. The first point AP1 is defined in a base substrate among the first substrate SUB1 and the second substrate SUB2 which is furthest from the laser device LD along the third direction DR3, at the transmission area PA.

As the laser beam LZ, an ultrashort pulse laser may be used. In an embodiment, for example, the laser beam LZ may be a femtosecond laser beam having pulses with duration of femtoseconds. However, the laser beam LZ should not be limited thereto or thereby. The forming of the connection portion CP (S4) may be performed using a laser beam LZ having a different wavelength.

Figure 13:
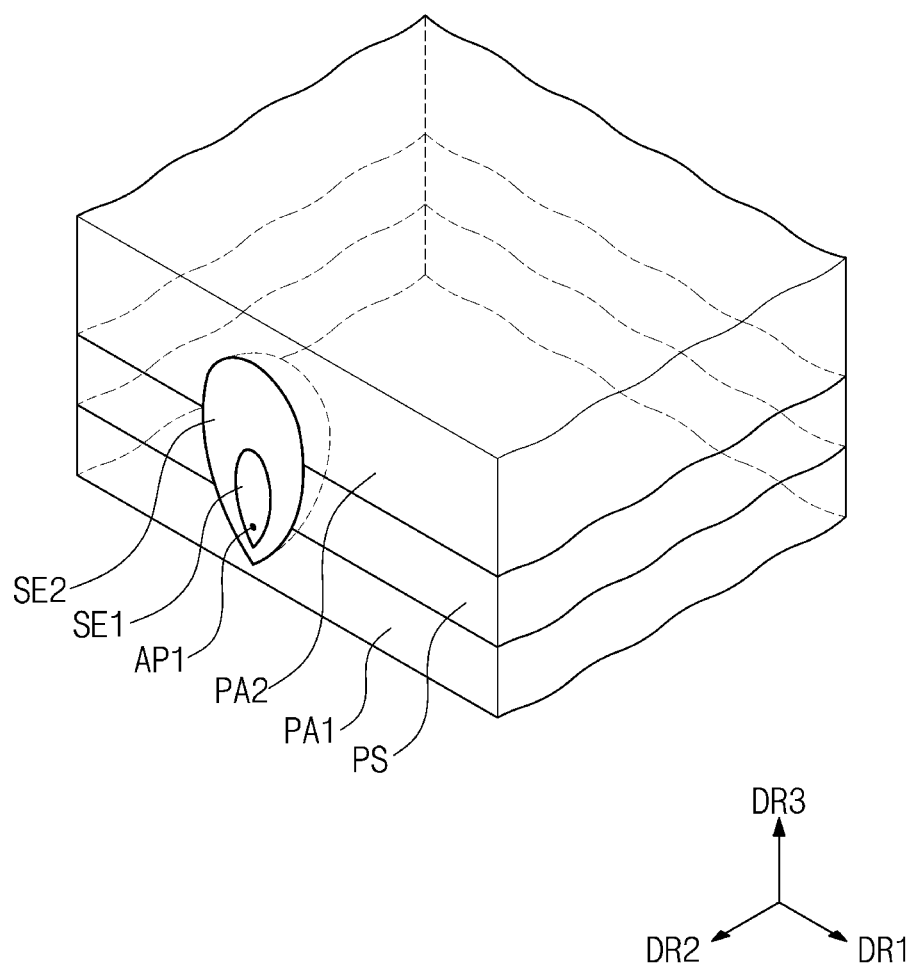
FIG. 13 is an enlarged perspective view showing an embodiment of a shape defined relative to a transparent material paste, by a laser beam in FIG. 12.

FIG. 13 is an enlarged perspective view showing an embodiment of a shape of a melted cross-section portion defined with respect to the glass paste PS by the laser beam LZ in FIG. 12.

Referring to FIG. 13, when the laser beam LZ is irradiated to the first point AP1 (e.g., irradiation point), a first shape SE1 (e.g., first cross-section shape) extending radially outward from the first point AP1 and a second shape SE2 (e.g., second cross-section shape) extending radially from the first shape SE1 may be provided or formed in the glass paste PS, the first transmission area PA1 and the second transmission area PA2. That is, the first shape SE1 and the second shape SE2 may each include an irradiated portion of the glass paste PS, the first substrate SUB1 and the second substrate SUB2, at the transmission area PA. Irradiation of the laser beam LZ at a single irradiation point provides the first shape SE1 and the second shape SE2 shown in FIG. 13 as extending outwardly from the single irradiation point in both the first direction DR1 and the second direction DR2. That is, the laser beam LZ at the start point melts each of a portion of the first substrate SUB1, the transparent material (e.g., glass paste PS) and a portion of the second substrate SUB2, to provide melted portions thereof. Referring to FIGS. 12 and 13, in an embodiment, movement of the laser beam LZ along the second direction DR2 elongates the first shape SE1 and the second shape SE2 along the second direction DR2.

In detail, when the laser beam LZ is irradiated to the first point AP1 within the first substrate SUB1, a high temperature area around the first point AP1 and a low temperature area which is around the high temperature area, may be generated. In an embodiment, for example, a temperature of the high temperature area may be about 5000° C., and a temperature of the low temperature area may be about 1000° C.

A first radial portion of the glass paste PS, a first radial portion of the first substrate SUB1 at the first transmission area PA1 and a first radial portion of the second substrate SUB2 at the second transmission area PA2, which are included in the high temperature area, may be melted. More accurately, the first radial portion of the glass paste PS, the first radial portion of the first transmission area PA1 and the first radial portion of the second transmission area PA2 which are included in the high temperature area, may be in a plasma state. A second radial portion of the glass paste PS, a second radial portion of the first substrate SUB1 at the first transmission area PA1, and a second radial portion of the second substrate SUB2 at the second transmission area PA2, which are included in the low temperature area, may be melted. The second radial portion of the glass paste PS, the second radial portion of the first transmission area PA1 and the second radial portion of the second transmission area PA2 which are included in the low temperature area, may not be in a plasma state, but are not limited thereto.

A stacked structure may include the first substrate SUB1, the glass paste PS and the second substrate SUB2, in order. The high temperature area and the low temperature area may be cooled when the laser beam LZ moves away from the first point AP1. The first shape SE1 may be defined as a portion of the stacked structure provided or formed by cooling the high temperature area. The second shape SE2 may be defined as a portion of the stacked structure provided or formed by cooling the low temperature area.

Referring to FIG. 12, the laser beam LZ is irradiated along the third direction DR3. Referring to FIG. 13, the first shape SE1 may have a three-dimensional shape. The first shape SE1 may extend radially from the first point AP1. In more detail, the first shape SE1 may have a dimension along the first direction DR1, the second direction DR2, and the third direction DR3. With reference to the first point AP1, the dimension of the first shape SE1 in the third direction DR3 is larger than the dimension in a direction opposite to the third direction DR3. In an embodiment, for example, the first shape SE1 may have a first teardrop shape.

The second shape SE2 may extend radially from the first shape SE1. In more detail, the second shape SE2 may have a dimension along the first direction DR1, the second direction DR2, and the third direction DR3. With reference to the first point AP1, the dimension of the second shape SE2 in the third direction DR3 is larger than the dimension in a direction opposite to the third direction DR3. In an embodiment, for example, the second shape SE2 may have a second teardrop shape. The first teardrop shape may be nested within the second teardrop shape.

Hereinafter, the providing or forming of the connection portion CP (S4) will be further described in detail.

FIGS. 14 to 18 are plan views showing processes in an embodiment of a method of irradiating the laser beam LZ. FIGS. 14 to 18 are views showing an embodiment of a method of manufacturing the display device DD having a pattern in FIG. 6. FIGS. 14 to 18 are plan views showing the cut surface of the glass paste PS which provides the cut surface of the connection portion CP.

Figure 14:
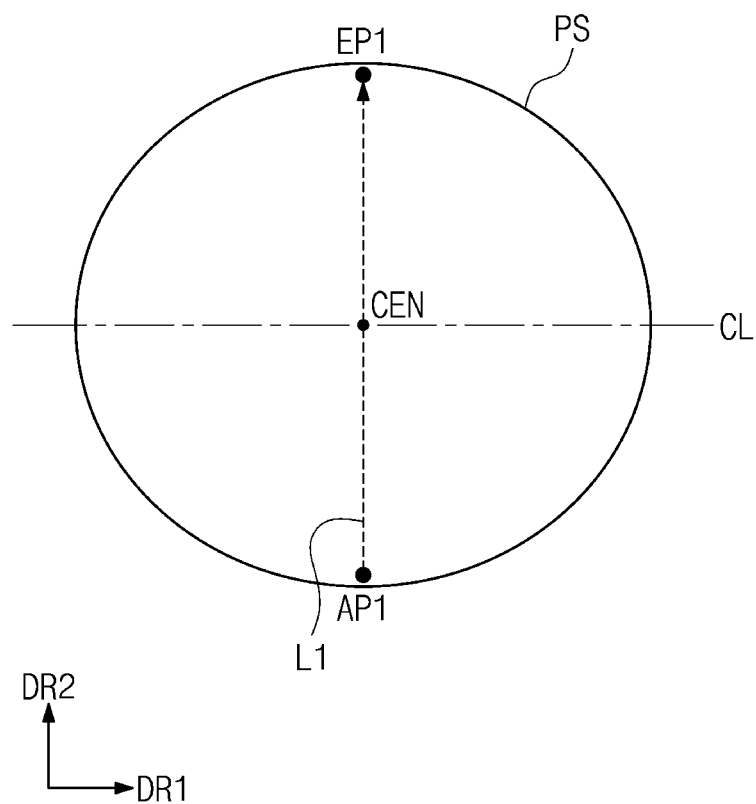
FIGS. 14 to 18 are enlarged plan views showing processes in an embodiment of a method of irradiating a laser beam.

Referring to FIGS. 12 and 14, the glass paste PS and the transmission area PA may each have a planar shape, and the planar shape of the glass paste PS may correspond to the planar shape of the transmission area PA when viewed in a plane. In an embodiment, for example, the glass paste PS may have a circular planar shape. Although not shown in figures, the first transmission area PA1 of the first substrate SUB1 and the second transmission area PA2 of the second substrate SUB2, which each overlaps or corresponds to the glass paste PS, may have a circular planar shape when viewed in a plane.

A planar shape of the connection portion CP may have a center point CEN. The planar shape of the glass paste PS may have a center point CEN which corresponds to that of the connection portion CP, without being limited thereto. The center point CEN may correspond to a center of the shape of the cut surface of the glass paste PS viewed in a plane.

The laser device LD may irradiate the laser beam LZ along an imaginary line (e.g., irradiation line or melting line) provided in plural including a plurality of imaginary lines. The plurality of imaginary lines may define a plurality of irradiation lines along which a laser beam LZ may be irradiated. The glass paste PS may include the imaginary line. The first substrate SUB1 may include the imaginary line. In an embodiment, for example, the imaginary line may be defined in the first transmission area PA1 of the first substrate SUB1.

The imaginary line may cross the center point CEN. The imaginary line may include a first line L1 (e.g., first irradiation line). The first line L1 may be defined by a line which crosses the center point CEN and connects the first point AP1 and a first end point EP1 to each other. The first end point EP1 may be symmetrical with the first point AP1 with respect to a reference line CL. The reference line CL may be a straight line that crosses the center point CEN and is substantially parallel to the first direction DR1. The first line L1 may be substantially parallel to the second direction DR2. The first point AP1 and the first end point EP1 may respectively correspond to opposing points defined along an outer edge of the glass paste PS. The opposing points may also be defined along an outer edge of the transmission area PA of the display device DD and/or the first transmission area PA1 of the first substrate SUB1. A plurality of start points and a plurality of end points described below may be defined along the outer edge of the glass paste PS, the transmission area PA of the display device DD and/or the first transmission area PA1 of the first substrate SUB1.

The first point AP1, the first end point EP1 and the first line L1 are imaginary configurations defined along the first substrate SUB1, however, for convenience of explanation, these features are shown along the cut surface of the glass paste PS.

The laser device LD may irradiate the laser beam LZ along the first line L1. The laser device LD may continuously irradiate the laser beam LZ from the first point AP1 as a starting point (e.g., first start point), to the first end point EP1 as an ending point.

Figure 15:
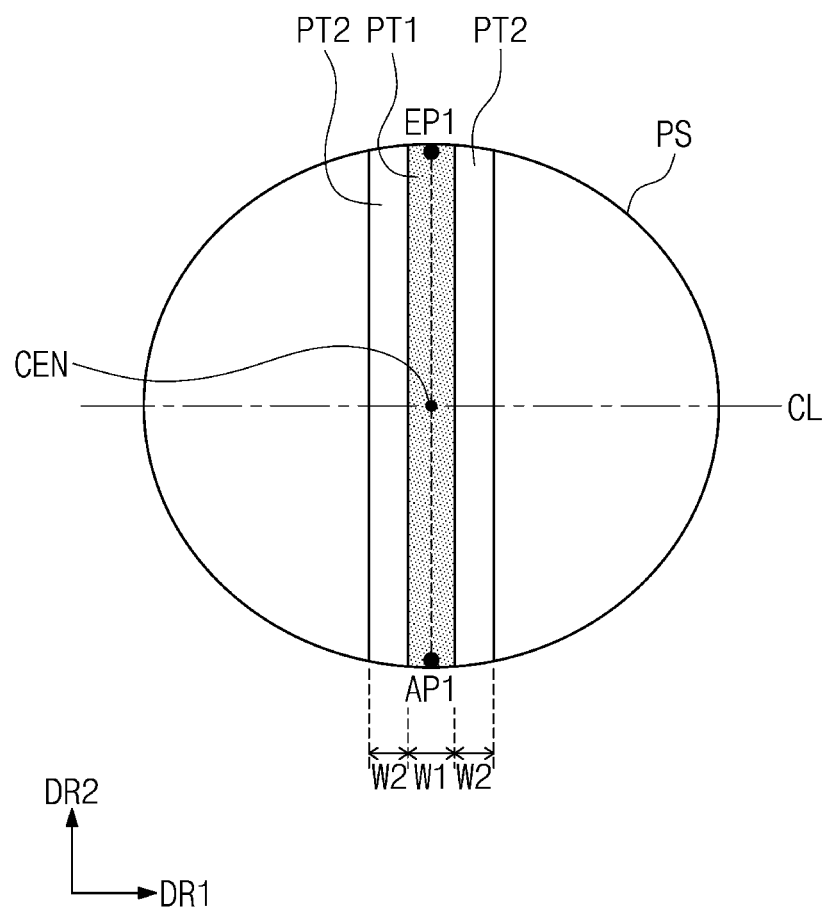

Referring to FIGS. 12 and 15, after the laser beam LZ is irradiated along the first line L1, the transmission area PA may include a first pattern portion PT1 extending along the first line L1, and a second pattern portion PT2 disposed adjacent to the first pattern portion PT1 at each of opposing sides thereof in the first direction DR1. In the plan view along the third direction DR3, each of the first pattern portion PT1 and the second pattern portion PT2 has a width along the first direction DR1 and a length along the second direction DR2. A width of the second pattern portion PT2 may include the width of the first pattern portion PT1.

The first pattern portion PT1 may be defined as a portion of the first shape SE1 which is continuously formed along the first line L1. The second pattern portion PT2 may be defined as a portion of the second shape SE2 continuously formed along the first line L1. That is, the first pattern portion PT1 may be a portion provided or formed by cooling the stacked structure at the high temperature area, and the second pattern portion PT2 may be a portion provided or formed by cooling the stacked structure at the low temperature area.

When viewed in a plane, the first pattern portion PT1 may have a bar shape extending along the second direction DR2. When viewed in a plane, the second pattern portion PT2 may have two bar shapes extending along the first direction DR1 from both of opposing sides of the first pattern portion PT1, to define a width of the second pattern portion PT2. When the first pattern portion PT1 and the second pattern portion PT2 are viewed with respect to a cross-section along the center line CL and along the third direction DR3, the first pattern portion PT1 and the second pattern portion PT2 may have the first shape SE1 and the second shape SE2, respectively, at the cut surface.

When viewed in a plane, a second width W2 of each of opposing portions of the second pattern portion PT2, which are respectively disposed at opposing sides of the first pattern portion PT1, may be equal to a first width W1 of the first pattern portion PT1. Referring to FIG. 15, when viewed in a plane, the width of the second pattern portion PT2 may be greater than a width of the first pattern portion PT1. However, the first width W1 and the second width W2 of the first pattern portion PT1 and the second pattern portion PT2, respectively, may vary according to a height of the cut surface within a total height of the glass paste PS. Referring to FIG. 13, for example, each of the first shape SE1 and the second shape SE1 has a width along the first direction DR1, and according to a position of a cut surface of the glass paste PS along the height thereof (e.g., along the third direction DR3), the widths may vary.

Figure 16:
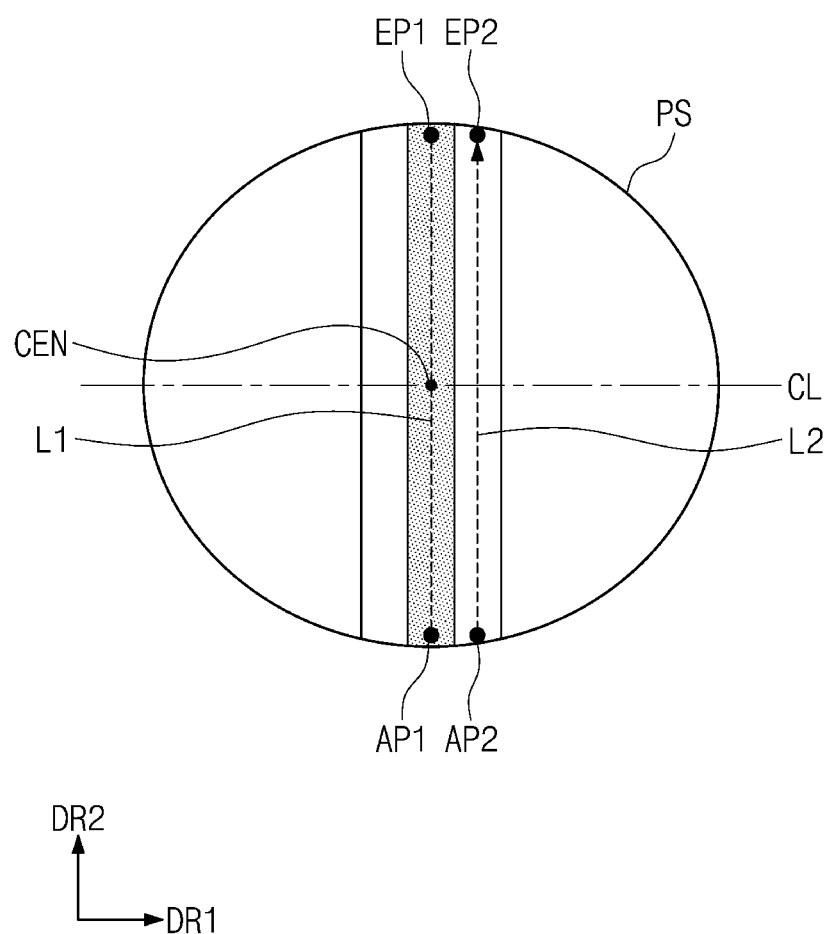

Referring to FIGS. 12 and 16, the imaginary line along which the laser beam LZ is irradiated may further include a second line L2 (e.g., second irradiation line). The second line L2 may be defined by a line which connects a second point AP2 and a second end point EP2 to each other. The second point AP2 may be spaced apart from the first point AP1 along the first direction DR1. The second end point EP2 may be symmetrical with the second point AP2 with reference to the center line CL. The second line L2 may be substantially parallel to the first line L1. The second line L2 is within a planar area of the second pattern portion PT2.

The laser device LD may further irradiate the laser beam LZ along the second line L2. The laser device LD may continuously irradiate the laser beam LZ from the second point AP2 as a starting point (e.g., second start point) to the second end point EP2.

Figure 17:
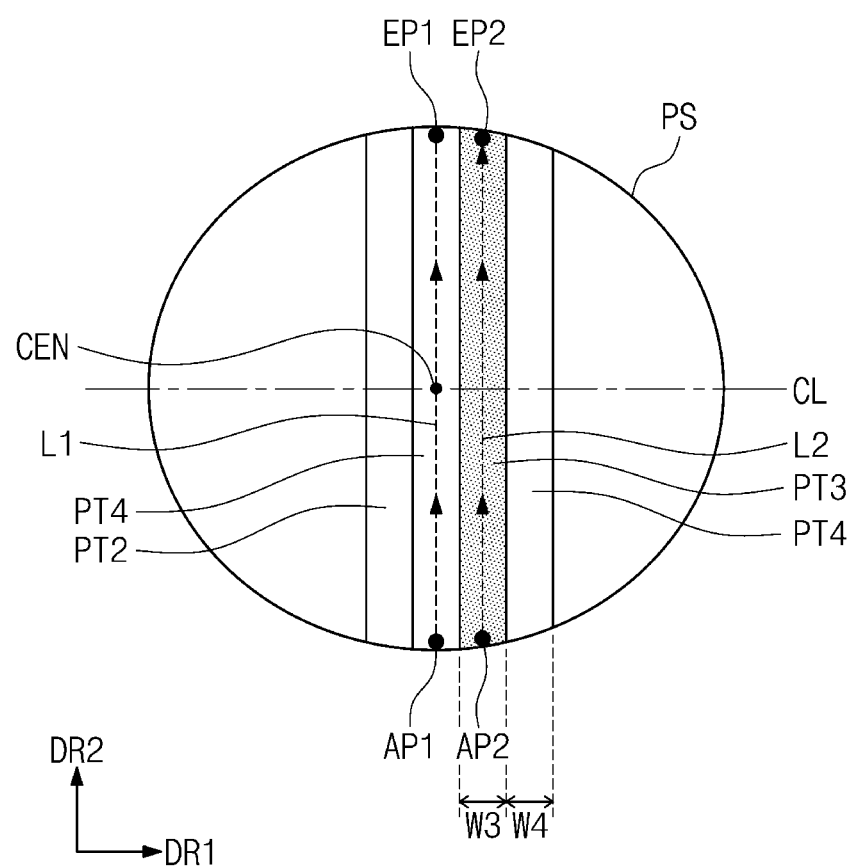

Referring to FIGS. 12 and 17, by irradiating the laser beam LZ along the second line L2, a third pattern portion PT3 (e.g., third cross-section pattern portion) extending along the second line L2 and a fourth pattern portion PT4 (e.g., fourth cross-section pattern portion) which is disposed adjacent to the third pattern portion PT3 may be defined in the glass paste PS, the first transmission area PA1 and the second transmission area PA2.

The third pattern portion PT3 may be defined as a portion of the first shape SE1 (refer to FIG. 13) which is continuously provided or formed along the second line L2. The fourth pattern portion PT4 may be defined as a portion of the second shape SE2 (refer to FIG. 13) which is continuously provided or formed along the second line L2. That is, the third pattern portion PT3 may be a portion provided or formed by cooling the stacked structure at the high temperature area, and the fourth pattern portion PT4 may be a portion provided or formed by cooling the stacked structure at the low temperature area.

When viewed in a plane, the third pattern portion PT3 may have a bar shape extending along the second direction DR2. When viewed in a plane, the fourth pattern portion PT4 may have two bar shapes extending along the first direction DR1 from both of opposing sides of the third pattern portion PT3. When the third pattern portion PT3 and the fourth pattern portion PT4 are viewed with respect to a cross-section along a center line CL and along the third direction DR3, the third pattern portion PT3 and the fourth pattern portion PT4 may have the first shape SE1 and the second shape SE2 shown in FIG. 13, respectively, at the cut surface.

When viewed in a plane, a fourth width W4 of each of opposing portions of the fourth pattern portion PT4, which are respectively disposed at opposing sides of the third pattern portion PT3, may be equal to a third width W3 of the third pattern portion PT3. Referring to FIG. 17, when viewed in a plane, the width of the fourth pattern portion PT4 may be greater than a width of the third pattern portion PT3.

The first pattern portion PT1 of FIG. 16 may be replaced by the left portion of the fourth pattern portion PT4. That is, irradiating the laser beam LZ along the second line L2, re-melts the stacked structure at the first pattern portion PT1 and changes the first pattern portion PT1 to the left one of the fourth pattern portion PT4.

Figure 18:
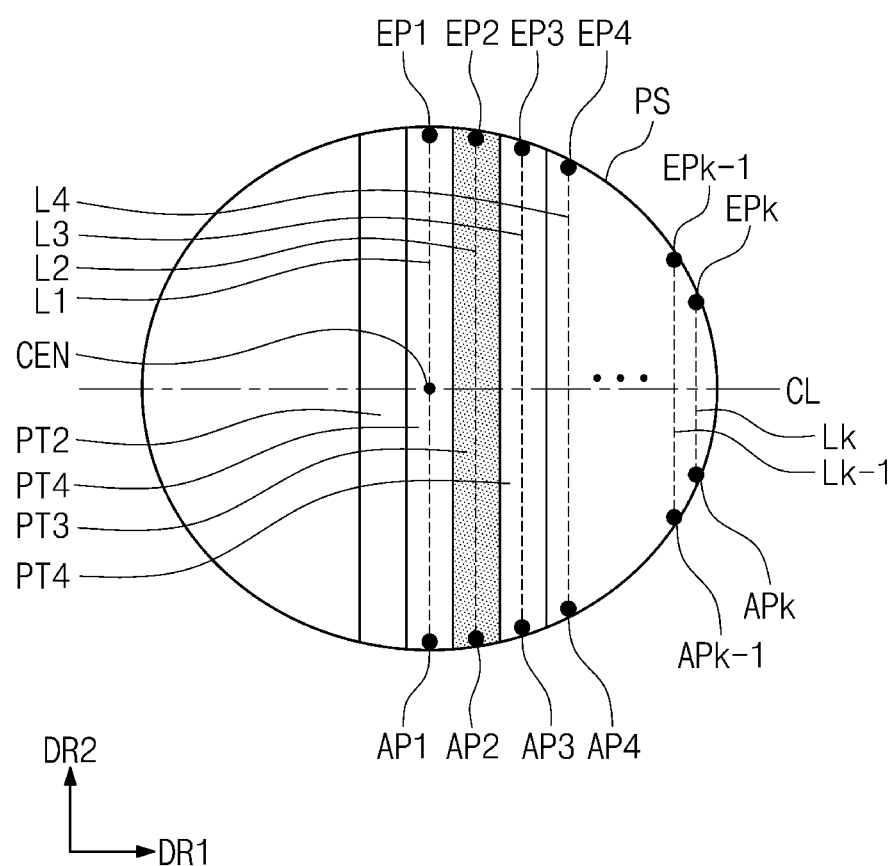

Referring to FIGS. 12 and 18, the laser device LD may further irradiate the laser beam LZ sequentially along a third line L3, a fourth line L4 . . . a (K−1)th line Lk−1, to a K-th line Lk (where 'k' is a natural number). The third line L3, the fourth line L4, the (K−1)th line Lk−1 and the K-th line Lk may be respectively defined by a line which connects a third point AP3, a fourth point AP4, a (K−1)th point APk−1 and a K-th point APk to a third end point EP3, a fourth end point EP4, a (K−1)th end point EPk−1 and a K-th end point EPk.

When the laser device LD irradiates the laser beam LZ along the K-th line Lk, a (2K−1)th pattern portion and a 2K-th pattern portion disposed at each of opposing sides of the (2K−1)th pattern portion may be provided or formed in the glass paste PS, the first transmission area PA1 and the second transmission area PA2. The (2K−1)th pattern portion may be a portion provided or formed by cooling the stacked structure at the high temperature area. The 2K-th pattern portion may be a portion provided or formed by cooling the stacked structure at the low temperature area. The (2K−1)th pattern portion may be an area disposed at a right edge of the second portion PP2 shown in FIG. 6.

The same process as the above-mentioned process may be performed on a left side of the cut surface of the glass paste PS, relative to the first line L1 introduced in FIG. 14. Consequently, the second portion PP2 (refer to FIG. 6) provided or formed by cooling the stacked structure at the high temperature area may be provided or formed at the edge of the cut surface of the glass paste PS, and the first portion PP1 may be provided or formed in the other areas.

The straight lines shown in FIG. 6 may be defined by portions of the light-transmitting connection portion (e.g., connection portion CP) which are adjacent to each other and respectively melted along different melting lines, without being limited thereto.

Figure 19:
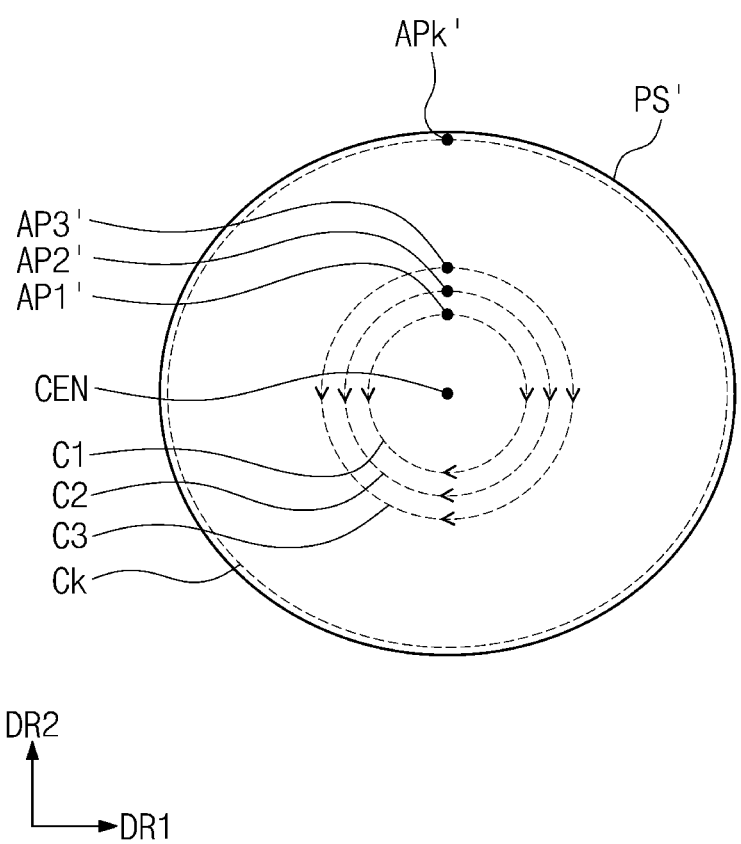
FIGS. 19 to 21 are enlarged plan views showing an embodiment of a method of providing a display device having a pattern in FIG. 7.
Figure 20:
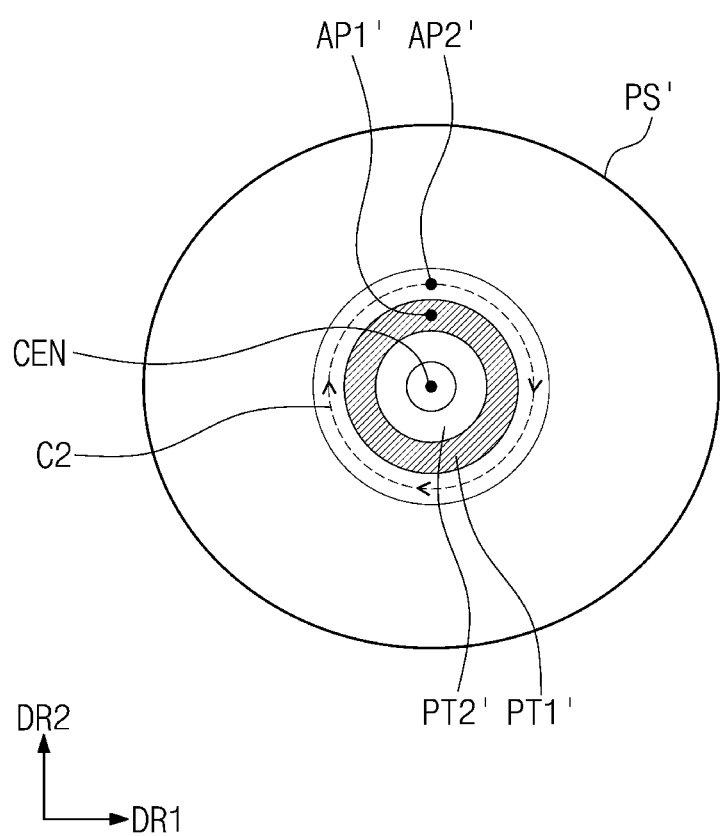
Figure 21:
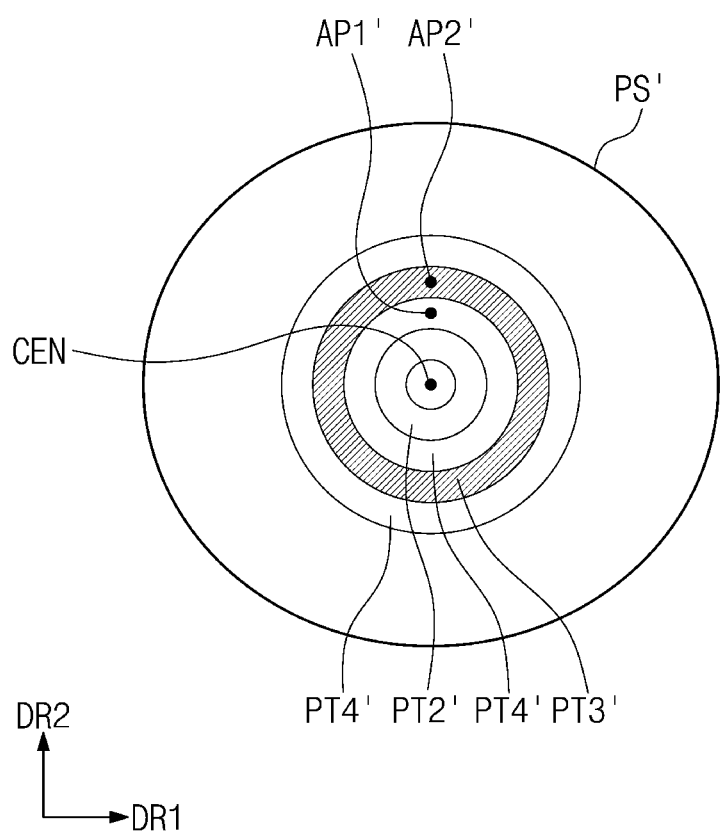

FIGS. 19 to 21 are views showing an embodiment of a method of manufacturing the display device DD having a pattern in FIG. 7.

Referring to FIG. 12 and FIGS. 19 to 21, the laser device LD may irradiate the laser beam LZ along an imaginary line. The imaginary line may include a plurality of concentric circles C1 to Ck. The concentric circles C1 to Ck may define diameters in the plan view, respectively, with respect to a center point CEN. Referring to FIG. 19, for example, a first concentric circle C1 may have the smallest diameter among the concentric circles C1 to Ck. A k-th concentric circle Ck may have the largest diameter among the concentric circles C1 to Ck. In an embodiment, the plurality of concentric circles C1 to Ck includes a first concentric circle C1 which is closest to the center point CEN and a second concentric circle C2 which is further from the center point CEN than the first concentric circle C1.

The laser device LD may sequentially irradiate the laser beam LZ along the plurality of concentric circles C1 to Ck in order from the first concentric circle C1 to the k-th concentric circle Ck.

The plurality of concentric circles C1 to Ck respectively includes irradiation start points AP1' to APk', at which irradiation of the laser beam LZ starts. When the laser device LD irradiates the laser beam LZ from a first point AP1' (e.g., first irradiation start point) along the first concentric circle C1 in a clockwise direction, a first pattern portion PT1' and a second pattern portion PT2' which is disposed at each of opposing sides of the first pattern portion PT1', may be provided or formed in a glass paste PS'. Although not shown in figures, the first pattern portion PT1' and the second pattern portion PT2' may be provided or formed in a first transmission area PA1 of a first substrate SUB1 and a second transmission area PA2 of a second substrate SUB2, which are each adjacent to the glass paste PS' along the third direction DR3.

The first pattern portion PT1' and the second pattern portion PT2' which is formed both inside and outside the first pattern portion PT1', may have a circular ring shape. In the plan view, each of the first pattern portion PT1' and the second pattern portion PT2' may have a thickness (e.g., ring width), and the thickness of the first pattern portion PT1' may be equal to the thickness of the second pattern portion PT2' formed inside the first pattern portion PT1' and/or a thickness of the second pattern portion PT2' formed outside the first pattern portion PT1'. The first pattern portion PT1' may be provided or formed by cooling the stacked structure at the high temperature area, and the second pattern portion PT2' may be provided or formed by cooling the stacked structure at the low temperature area.

When the laser device LD irradiates the laser beam LZ from a second point AP2' (e.g., second irradiation start point) along a second concentric circle C2 in a clockwise direction, a third pattern portion PT3' and a fourth pattern portion PT4' which is disposed both inside and outside the third pattern portion PT3', may be provided or formed in the glass paste PS'. The third pattern portion PT3' and the fourth pattern portion PT4' may have a circular ring shape. The third pattern portion PT3' may be provided or formed by cooling the stacked structure at the high temperature area, and the fourth pattern portion PT4' may be provided or formed by cooling the stacked structure at the low temperature area.

When the laser device LD irradiates the laser beam LZ along the second concentric circle C2, the first pattern portion PT1' may be replaced by the fourth pattern portion PT4'. In detail, irradiating the laser beam LZ along the second concentric circle C2, re-melts the stacked structure at the first pattern portion PT1' and changes the first pattern portion PT1' to the fourth pattern portion PT4'.

Then, the laser device LD may sequentially irradiate the laser beam LZ from a third concentric circle C3 to the k-th concentric circle Ck. The connection portion CP may be defined as the glass paste PS' which has been irradiated by the laser beam LZ of the laser device LD, in order from the first concentric circle C1 to the k-th concentric circle Ck Consequently, a (2k−1)th pattern portion may remain on an outer edge of a cut surface of the connection portion CP. The (2k−1)th pattern portion may be provided or formed by cooling the stacked structure at the high temperature area. The (2k−1)th pattern portion may be the second portion PP2' shown in FIG. 7. The first portion PP1' (refer to FIG. 7), which is provided or formed by cooling the stacked structure at the low temperature area, may be formed in the other portion of the cut surface of the glass paste PS'.

The plurality of concentric circles C1 to Ck may be defined by portions of the light-transmitting connection portion (e.g., connection portion CP) which are adjacent to each other and respectively melted along different melting lines, without being limited thereto.

Referring to FIGS. 5 and 8, the sealing portion SL may be provided or formed between the first substrate SUB1 and the second substrate SUB2 (S5). The sealing portion SL may be disposed along the edge of the first substrate SUB1. The sealing portion SL may include an adhesive material layer. The edge of the first substrate SUB1 may be coupled to the edge of the second substrate SUB2 by the sealing portion SL. The sealing portion SL may define the gap GP between the first substrate SUB1 and the second substrate SUB2.

The sensor portion SP may be disposed under the first substrate SUB1 (S6). The sensor portion SP may be disposed to overlap or correspond to the transmission area PA. In more detail, the sensor portion SP may be disposed to overlap or correspond to the center area CA of the transmission portion PA. Accordingly, the sensor portion SP may overlap or correspond to the first portion PP1 of the connection portion CP (refer to FIG. 6).

Figure 22:
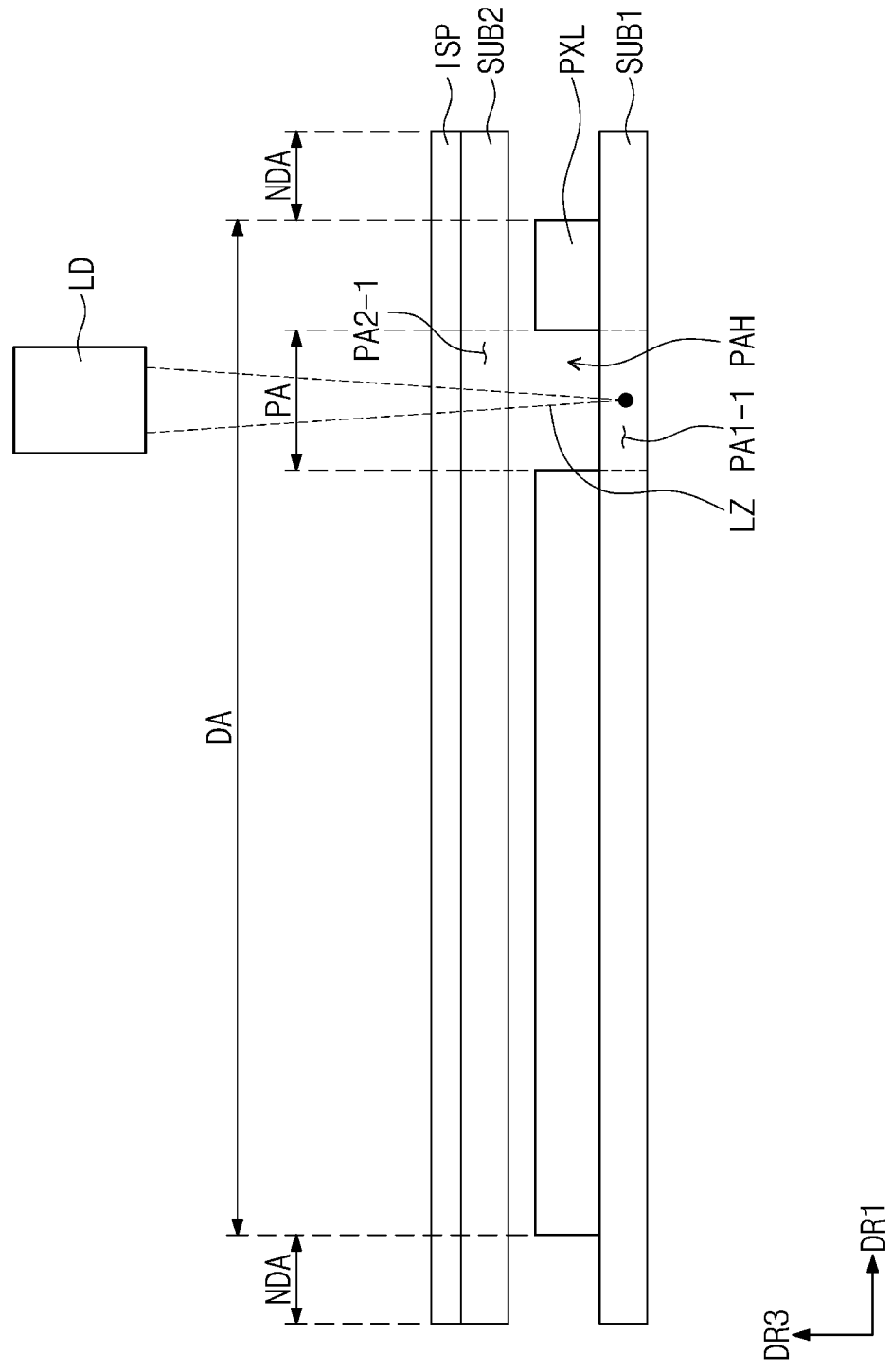
FIGS. 22 to 24 are cross-sectional views showing an embodiment of a method of manufacturing a display device.
Figure 23:
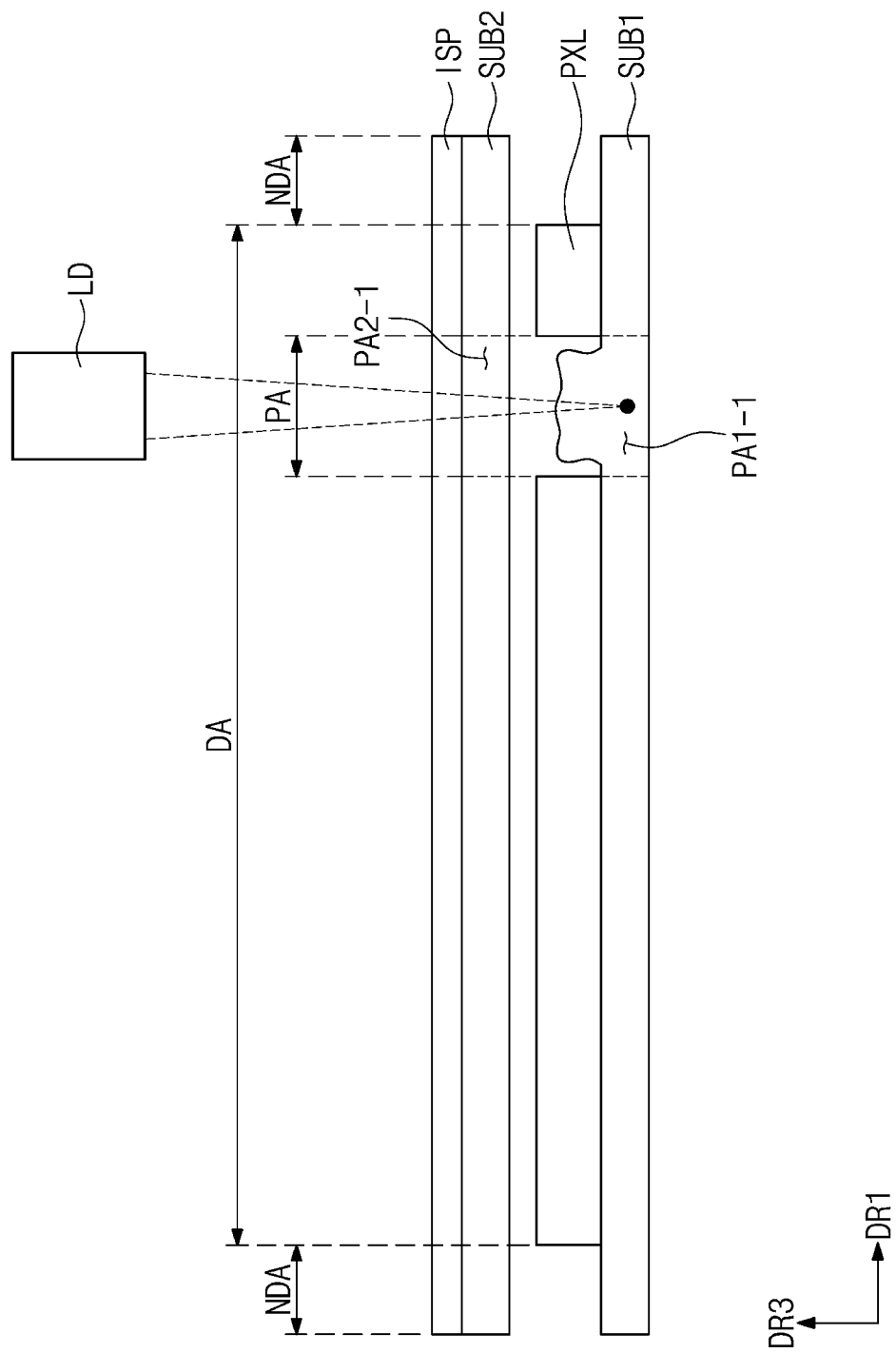
Figure 24:
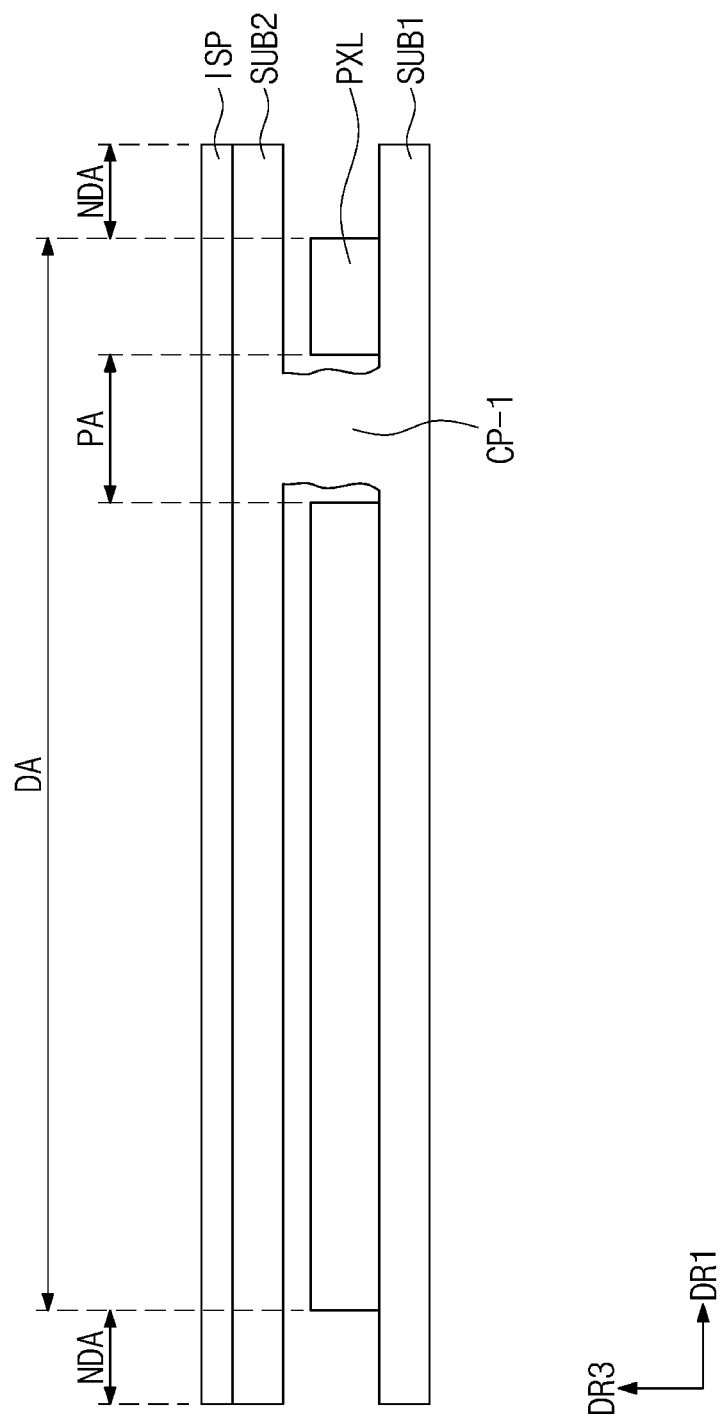

FIGS. 22 to 24 are cross-sectional views showing an embodiment of a method of manufacturing a display device DD. In FIGS. 22 to 24, detailed descriptions of the same elements as those in the above-described embodiments will be omitted.

Referring to FIGS. 22 to 24, a first substrate SUB1 may be a glass substrate. The first substrate SUB1 may include a first transmission area PA1-1 and portions of a display area DA which are around the first transmission area PA1-1. A pixel layer PXL may be disposed on an upper surface of the first substrate SUB1. The pixel layer PXL may overlap or correspond to the display area DA. The pixel layer PXL may be excluded from the first transmission area PA1-1. Accordingly, a transmission hole PAH which corresponds to the transmission area PA may be defined through a thickness of the pixel layer PXL.

A second substrate SUB2 may be disposed to face the first substrate SUB1. The second substrate SUB2 may be spaced apart from the pixel layer PXL disposed on the first substrate SUB1.

The second substrate SUB2 may include a second transmission area PA2-1. The second transmission area PA2-1 may overlap or corresponds to the first transmission area PA1-1. The second substrate SUB2 may be a transparent substrate. In an embodiment, for example, the second substrate SUB2 may include a glass material.

Referring to FIG. 22, a laser device LD may irradiate a laser beam to the first substrate SUB1 at the first transmission area PA1-1 thereof. The laser device LD may irradiate the laser beam LZ along an imaginary line defined in the first transmission area PA1-1. A process of irradiating the laser beam LZ is as described above.

Referring to FIG. 23, a portion of the first substrate SUB1 in the first transmission area PA1-1 thereof may be melted by the laser beam LZ to define a melted portion. The melted portion of the first substrate SUB1 may protrude toward the second substrate SUB2 along the third direction DR3. The melted portion may extend to the second substrate SUB2 and meet the second substrate SUB2 at the second transmission area PA2-1 thereof. That is, the melted portion may couple the first substrate SUB1 to the second substrate SUB2 at the transmission area PA. Consequently, a second connection portion CP-1 which includes the melted portion of the first substrate SUB1 may be provided or formed between the first substrate SUB1 and the second substrate SUB2.

Figure 25:
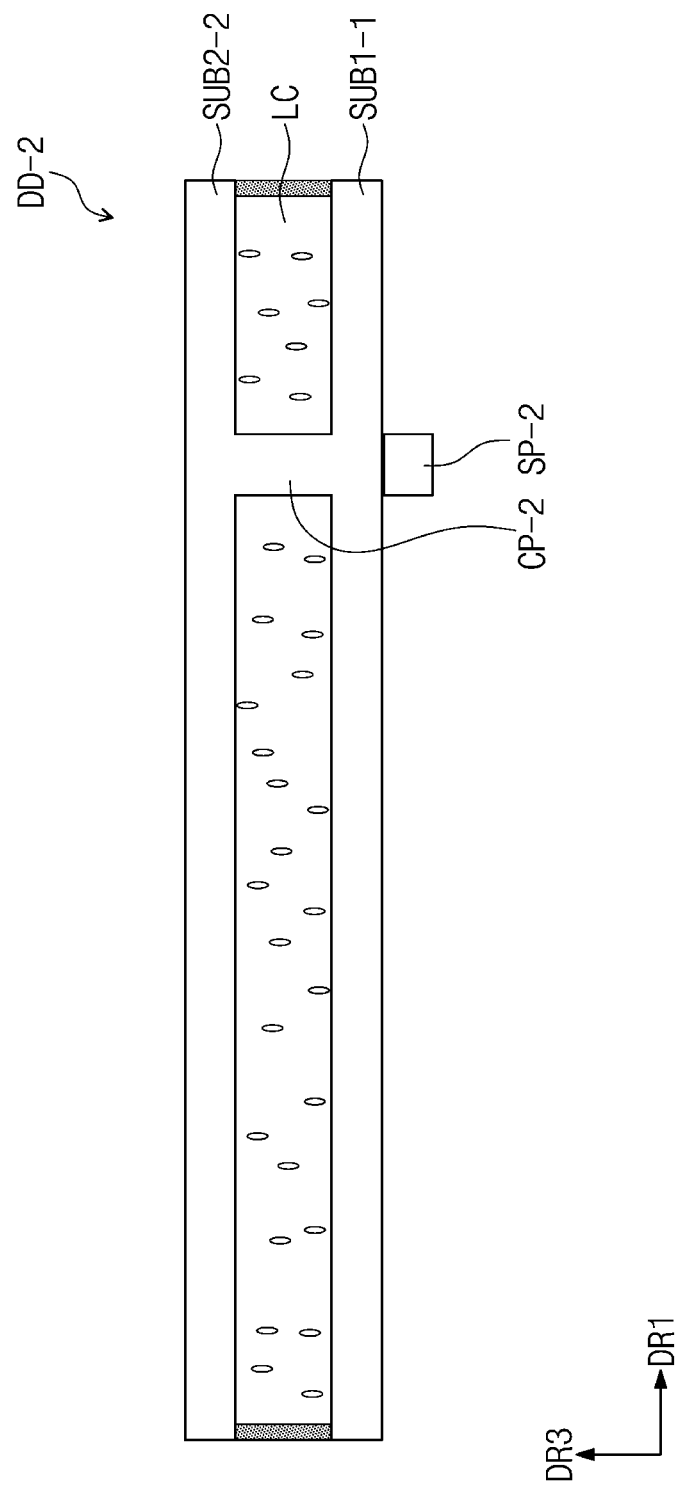
FIG. 25 is a cross-sectional view showing an embodiment of a display device.

FIG. 25 is a cross-sectional view showing an embodiment of a display device DD-2.

Referring to FIG. 25, the display device DD-2 may be, but not limited to, a liquid crystal display device. In detail, the display device DD-2 may include a first substrate SUB1-1 (e.g., first transparent substrate), a second substrate SUB2-2 (e.g., second transparent substrate), an image display layer as a liquid crystal layer LC which is disposed between the first substrate SUB1-1 and the second substrate SUB2-2, and a third connection portion CP-2 connecting the first substrate SUB1-1 and the second substrate SUB2-2.

The first substrate SUB1-1 may include a transistor and a pixel electrode which is connected to the transistor. The second substrate SUB2-2 may include a common electrode. Each of the first substrate SUB1-1 and the second substrate SUB2-2 may be a transparent substrate. The liquid crystal layer LC may include a plurality of liquid crystal molecules. The third connection portion CP-2 may be coplanar with the liquid crystal layer LC.

The display device DD-2 may include a backlight unit (not shown) which is disposed under the first substrate SUB1-1 and provides light for displaying an image IM. The display device DD-2 may control a transmittance of a light provided thereto from the backlight unit to display an image IM. The light transmittance may be determined by an alignment of the liquid crystal molecules aligned in response to an electric field formed between the electrodes of the first substrate SUB1-1 and the second substrate SUB2-2.

The third connection portion CP-2 may include a transparent material. In an embodiment, for example, the third connection portion CP-2 may include a glass material. The third connection portion CP-2 may be provided or formed by the above-described manufacturing processes. In an embodiment, for example, the third connection portion CP-2 may be provided or formed by printing a glass paste PS on the second substrate SUB2-2 and irradiating a laser beam LZ onto the glass paste PS.

A second sensor portion SP-2 may be disposed under the first substrate SUB1-1. The second sensor portion SP-2 may overlap the third connection portion CP-2.

An external light incident to the display device DD-2 may reach the second sensor portion SP-2 through a light transmission path defined at a transmission area PA by portions of the second substrate SUB2-2, the third connection portion CP-2 and the first substrate SUB1-1 which are aligned in a light transmission direction (e.g., the third direction DR3).

According to one or more embodiment, a space between the first substrate SUB1-1 and the second substrate SUB2-2 may be filled with the third connection portion CP-2 including the glass material, and thus, a light efficiency of the light that reaches the second sensor portion SP-2 may be improved.

In addition, as the first substrate SUB1-1 and the second substrate SUB2-2 are connected to each other by the third connection portion CP-2, the durability of the display device DD-2 may be improved.

Although the embodiments have been described, it is understood that the invention should not be limited to these embodiments but various changes and modifications can be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. A method of manufacturing a display device, comprising:
   providing an image display layer on a first substrate comprising a first transmission area and a display area which is adjacent to the first transmission area in a direction, the image display layer overlapping the display area;
   providing a second substrate facing the first substrate, the second substrate comprising a second transmission area overlapping the first transmission area;
   providing a transparent material between the first transmission area and the second transmission area;
   melting each of a portion of the first transmission area adjacent to the transparent material, the transparent material, and a portion of the second transmission area adjacent to the transparent material to form a connection portion which connects the first transmission area and the second transmission area; and
   providing a sealing portion along an edge of the first substrate to connect the first substrate with the second substrate, the sealing portion defining an area within which the first and second transmission areas and the connection portion are disposed,
   wherein along the direction in which the display area is adjacent to the first transmission area, the connection portion defines a first area having a first optical property and a second area having a second optical property different from the first optical property.

2. The method of claim 1, wherein the forming of the connection portion comprises providing a laser beam to the portion of the first transmission area adjacent to the transparent material which melts each of the portion of the first transmission area adjacent to the transparent material, the transparent material, and the portion of the second transmission area adjacent to the transparent material to form the connection portion as an integral body having melted portions of each of the first substrate at the first transmission area thereof, the transparent material and the second substrate at the second transmission area thereof.

3. The method of claim 2, wherein the laser beam is irradiated along an imaginary line defined in the first transmission area.

4. The method of claim 3, wherein
   when the laser beam is irradiated onto a first point of the imaginary line, a first cross-section shape extending radially from the first point and a second cross-section shape extending radially from the first cross-section shape are formed in the transparent material, the first transmission area, and the second transmission area, and
   the first cross-section and the second cross-section shape have the first optical property and the second optical property, respectively.

5. The method of claim 4,
   wherein when the laser beam is continuously irradiated onto a first line of the imaginary line, a first pattern portion extending along the first line and a second pattern portion adjacent to the first pattern portion are formed in the transparent material, the first transmission area, and the second transmission area, and
   wherein the first line extends from the first point of the imaginary line, the first pattern portion is defined by first cross-section shapes consecutively formed along the first line, and the second pattern portion is defined by second cross-section shapes consecutively formed along the first line.

6. The method of claim 5, wherein the second optical property of the second cross-section includes a light transmittance which is higher than a light transmittance of the first optical property.

7. The method of claim 5,
   wherein when the laser beam is continuously irradiated onto a second line of the imaginary line, a third pattern portion extending along the second line and a fourth pattern portion adjacent to the third pattern portion are formed in the transparent material, the first transmission area, and the second transmission area, and
   wherein the second line extends from a second point spaced apart from the first point, the third pattern portion is defined by first cross-section shapes consecutively formed along the second line, the fourth pattern portion is defined by second cross-section shapes consecutively formed along the second line, and the first pattern portion is removed by the fourth pattern portion.

8. The method of claim 3, wherein
   the imaginary line comprises a plurality of lines, the plurality of lines are spaced apart from each other along a first direction, and
   each of the plurality of lines extends along a second direction which crosses the first direction.

9. The method of claim 3, wherein each of the first transmission area, the transparent material and the second transmission area has a circular shape when viewed in a plane, the circular shape having a center.

10. The method of claim 9, wherein the imaginary line comprises a plurality of concentric circles defined with respect to a center point corresponding to the center of the transparent material.

11. The method of claim 10, wherein the laser beam is sequentially irradiated along the plurality of concentric circles from a concentric circle having the smallest diameter to a concentric circle having the largest diameter among the plurality of concentric circles.

12. The method of claim 2, wherein the laser beam comprises an ultrashort pulse laser.

13. The method of claim 1, wherein the providing of the transparent material comprises printing the transparent material on a surface of the second transmission area facing the first transmission area.

14. The method of claim 1, further comprising providing a sensor under the first substrate to overlap the first transmission area.

15. A method of manufacturing a display device, comprising:
   providing a first transparent substrate comprising a first transmission area and a display area which is adjacent to the first transmission area in a direction;
   providing a second transparent substrate facing the first transparent substrate and comprising a second transmission area overlapping the first transmission area;
   providing a laser beam onto the first transmission area and melting at least a portion of the first transmission area to form a connection portion as an integral body having melted portions of each of the first transparent substrate at the first transmission area thereof and the second transparent substrate at the second transmission area thereof; and
   providing a sealing portion along an edge of the first substrate to connect the first substrate with the second substrate, the sealing portion defining an area within which the first and second transmission areas and the connection portion are disposed,
   wherein along the direction in which the display area is adjacent to the first transmission area, the connection portion defines a first area having a first optical property and a second area having a second optical property different from the first optical property.

16. The method of claim 15, wherein the forming of the connection portion comprises:
   irradiating the laser beam along a first line defined in the first transmission area to form a first cross-section pattern portion extending along the first line and a second cross-section pattern portion adjacent to the first cross-section pattern portion; and
   irradiating the laser beam along a second line defined in the second transmission area to form a third cross-section pattern portion extending along the second line and a fourth cross-section pattern portion adjacent to the third cross-section pattern portion, and wherein the first cross-section pattern portion is removed by the fourth cross-section pattern portion.

17. A display device comprising:
   a first substrate comprising a first transmission area and a display area which is adjacent to the first transmission area in a direction;
   a pixel layer disposed on the first substrate and overlapping the display area;
   a second substrate facing the first substrate and comprising a second transmission area overlapping the first transmission area;
   a connection portion disposed between the first transmission area and the second transmission area; and
   a sealing portion disposed along an edge of the first substrate to connect the first substrate with the second substrate, the sealing portion defining an area within which the first and second transmission areas and the connection portion are disposed,
   wherein
   the first transmission area adjacent to the connection portion, the connection portion, and the second transmission area adjacent to the connection portion comprise:
      a first portion having a first optical property; and
      a second portion which is adjacent to the first portion along the direction in which the display area and the first transmission area are adjacent and has a second optical property different from the first optical property,
      wherein the first portion has an area greater than an area of the second portion.

18. The display device of claim 17, further comprising:
   a cover panel disposed under the first substrate; and
   a sensor disposed in a sensor hole defined in the cover panel and overlapping the first transmission area,
   wherein the first portion overlaps the sensor, and the second portion overlaps an area between the sensor and the sensor hole.

19. The display device of claim 17, wherein
   the connection portion is defined by an integral body having melted portions of each of the first substrate at the first transmission area thereof and the second substrate at the second transmission area thereof, and
   the connection portion has a pattern including a plurality of straight lines on a cut surface substantially parallel to the first substrate when viewed in a plane.

20. The display device of claim 17, wherein
   the connection portion is defined by an integral body having melted portions of each of the first substrate at the first transmission area thereof and the second substrate at the second transmission area thereof, and
   the connection portion has a pattern including a plurality of concentric circles on a cut surface substantially parallel to the first substrate when viewed in a plane.

* * * * *